(12) United States Patent
Adams et al.

(10) Patent No.: US 12,170,364 B2
(45) Date of Patent: Dec. 17, 2024

(54) LAYERED ELECTRODE MATERIALS AND METHODS FOR RECHARGEABLE ZINC BATTERIES

(71) Applicant: Salient Energy Inc., Dartmouth (CA)

(72) Inventors: Brian D. Adams, Dartmouth (CA);
Ryan D. Brown, Kitchener (CA);
Marine Cuisinier, Dartmouth (CA);
Susi Jin, Richmond Hill (CA)

(73) Assignee: Salient Energy Inc., Dartmouth (CA)

( * ) Notice: Subject to any disclaimer, the term of this patent is extended or adjusted under 35 U.S.C. 154(b) by 256 days.

(21) Appl. No.: 16/766,737

(22) PCT Filed: Dec. 5, 2018

(86) PCT No.: PCT/CA2018/051558
§ 371 (c)(1),
(2) Date: May 25, 2020

(87) PCT Pub. No.: WO2019/109185
PCT Pub. Date: Jun. 13, 2019

(65) Prior Publication Data
US 2020/0395606 A1 Dec. 17, 2020

Related U.S. Application Data

(60) Provisional application No. 62/594,845, filed on Dec. 5, 2017.

(51) Int. Cl.
*H01M 4/36* (2006.01)
*C01G 53/00* (2006.01)
(Continued)

(52) U.S. Cl.
CPC ........... *H01M 4/366* (2013.01); *C01G 53/50* (2013.01); *H01M 4/38* (2013.01); *H01M 4/505* (2013.01);
(Continued)

(58) Field of Classification Search
None
See application file for complete search history.

(56) References Cited

U.S. PATENT DOCUMENTS 6,187,475 B1   2/2001   Oh et al.

FOREIGN PATENT DOCUMENTS

JP   2005322551 A   * 11/2005

OTHER PUBLICATIONS

Renuka et al., "An investigation of layered birnessite type manganese oxides for battery application", Apr. 2000, Journal of Power Sources, A, 87, pp. 144-152 (Year: 2000).*

(Continued)

*Primary Examiner* — Daniel S Gatewood
(74) *Attorney, Agent, or Firm* — Own Innovation; James W. Hinton

(57) ABSTRACT

Layered electrode materials, positive electrodes, rechargeable zinc batteries, and methods are provided. A layered electrode material for use in a rechargeable zinc battery includes a plurality of active metal slab layers in a layered configuration. The active metal slab layer includes a plurality of redox active metal centers and a closely-packed anionic sublattice. A plurality of interlamellar spaces separate adjacent active metal slab layers in the layered configuration. The interlamellar space includes at least one pillar species. The layered electrode material has a combined average metal oxidation state in a range of +3 to +4 in an initial charged state. The layered electrode material accepts solvated zinc cations via intercalation into the interlamellar space upon reduction.

20 Claims, 18 Drawing Sheets

(51) Int. Cl.
*H01M 4/38* (2006.01)
*H01M 4/505* (2010.01)
*H01M 4/525* (2010.01)
*H01M 10/36* (2010.01)

(52) U.S. Cl.
CPC ........... *H01M 4/525* (2013.01); *H01M 10/36* (2013.01); *C01P 2002/22* (2013.01); *C01P 2002/74* (2013.01); *C01P 2002/76* (2013.01); *C01P 2002/77* (2013.01); *C01P 2004/03* (2013.01); *C01P 2006/40* (2013.01); *H01M 2300/0005* (2013.01)

(56) References Cited

OTHER PUBLICATIONS

Lee et al., "Elucidating the intercalation mechanism of zinc ions into a-MnO2 for rechargeable zinc batteries", 2015, Chem Commun., 51, 9265-9268 (Year: 2015).*
European Patent Office, Extended European Search Report for EP Patent App. No. 18886519.0, Sep. 1, 2021.
Fu et al., "Physical characterization, electrochemical performance and storage stability of spherical Al-substituted γ-NiOOH", Electrochimica Acta, vol. 52, No. 5, Nov. 2006, pp. 2109-2115.
Lee et al., "Elucidating the intercalation mechanism of zinc ions into α-MnO2 for rechargeable zinc batters", Chem. Commun., 2015, 51, pp. 9265-9268.
CIPO AS ISA, International Search Report and Written Opinion for PCT/CA2018/051558, Mar. 1, 2019.
Guerlou-Demourgues et al. "New manganese-substituted nickel hydroxides Part 1, Crystal chemistry and physical characterization", Journal of Power Sources, 1994, pp. 269-274.
Liu et al. "Physical and electrochemical characteristics of aluminum-substituted nickel hydroxide", Journal of Applied Electrochemistry, 1999, pp. 855-860.
Renuka et al., "An investigation of layered birnessite type manganese oxides for battery application", Journal of Power Sources, Apr. 2000, pp. 144-152.
Wan et al., "Aqueous rechargeable zinc/sodium vanadate batteries with enhanced performance from simultaneous insertion of dual carriers", Nature Communications, 9, articles No. 1656, Apr. 25, 2018.
Xing et al., "Aqueous intercalation-type electrode materials for grid energy storage: Beyond the limits of lithium and sodium", Nano Energy, May 2018, pp. 229-244.

* cited by examiner

LAYERED ELECTRODE MATERIALS AND METHODS FOR RECHARGEABLE ZINC BATTERIES

TECHNICAL FIELD

The following relates generally to secondary electrochemical cells, and more particularly to layered electrode materials for rechargeable zinc batteries.

INTRODUCTION

Metallic zinc negative electrodes are used in primary and secondary aqueous battery types. Zinc is inexpensive, non-toxic, has a low redox potential (−0.76 V vs. standard hydrogen electrode [SHE]) compared to other negative electrode materials used in aqueous batteries, and is stable in water due to a high overpotential for hydrogen evolution.

A rechargeable zinc intercalation cell has a positive electrode material that can reversibly intercalate zinc ions. Since zinc ions carry a 2+ charge, they are surrounded by a tightly-coordinated solvent shell that increases the effective ionic radius of the zinc ion compared to monovalent (1+) cations such as lithium, sodium, and potassium. Therefore, zinc intercalation materials are designed to facilitate movement of the solvated zinc ion through the material to avoid an energy barrier associated with desolvation.

In water-based (aqueous) electrolytes, the solvent shell includes water molecules coordinated around the $Zn^{2+}$ cation with a hydration structure of $[Zn(H_2O)_n]^{2+}$, where n can range between 1 and 6. The total ionic radius of the fully hydrated (solvated) zinc cation (i.e. $[Zn(H_2O)_6]^{2+}$) in octahedral coordination is greater than 5 Å (Zn—O bond distance ~2 Å, O—H bond distance in water ~0.96 Å, radius of $Zn^{2+}$ ~0.88 Å). This ionic radius is significantly greater than unsolvated $Zn^{2+}$ (0.88 Å).

One family of compounds for reversibly intercalating/deintercalating $Zn^{2+}$ are hydrated, layered vanadium oxides. U.S. Pat. No. 9,780,412 to Adams et al. (U.S. Pat. No. 9,780,412) describes a rechargeable zinc battery using $Zn_{0.25}V_2O_5 \cdot nH_2O$ as the positive electrode, 1 M $ZnSO_3$/$H_2O$ as the electrolyte, and a zinc metal negative electrode. The disclosed rechargeable zinc battery was able to cycle for over 1000 times by the mechanism of $Zn^{2+}$ intercalation/deintercalation during discharge/charge into/from the $Zn_{0.25}V_2O_5 \cdot nH_2O$ compound with a high specific capacity between 250-300 mAh/g at low current rates.

The use of vanadium oxides may have some disadvantages. One such disadvantage is the relatively low potential of the multiple redox couples associated with $V^{4+}/V^{5+}$, $V^{3+}/V^{4+}$, and $V^{2+}/V^{3+}$ with respect to the zinc negative electrode ($Zn^0/Zn^{2+}$). For example, the $Zn_{0.25}V_2O_5 \cdot nH_2O$ compound portrayed an average discharge voltage of ~0.8 V. The lower the voltage of the individual cell, the more cells need to be added in series to provide a given voltage. It is therefore desirable to provide a rechargeable zinc cell that has an increased voltage over the voltage of the $Zn\|Zn_{0.25}V_2O_5 \cdot nH_2O$ cell. This may be achieved by replacing the $Zn_{0.25}V_2O_5 \cdot nH_2O$ with a material that provides a higher discharge voltage.

Transition metals nickel, iron, cobalt, and chromium have been used in Li-ion batteries as positive electrode materials. For example, $LiFePO_4$ (LFP), $LiCoO_2$ (LCO), $LiN_{0.33}Co_{0.33}Mn_{0.33}O_2$ (NMC), and $LiN_{0.8}Co_{0.15}Al_{0.05}O_2$ (NCA)). Such use has been to intercalate/deintercalate $Li^+$ (rather than $Zn^{2+}$) and using non-aqueous electrolytes (instead of aqueous electrolytes). Some of these Li-ion positive electrode materials, such as LCO, NMC, and NCA (are layered structures) possess basal-plane spacings (e.g. 4.6 to 4.8 Å) that are too small to fit solvated $Zn^{2+}$ cations.

There are many examples of suitable compounds which can intercalate divalent cations such as zinc; however, not all are suitable for use in zinc ion batteries. For example, clay materials such as montmorillonite and vermiculite, while known to have high cation exchange capacity when they are hydrated with water (i.e. water is present in the interlamellar space), do not contain redox active metals in the slab layers.

The voltage of the cell is dictated by the redox active metals in the slab layers according to the equation, $E_{cell}=E_c-E_a$, where $E_c$ is the potential of the cathode and $E_a$ is the potential of the anode (Zn: −0.76 V vs. standard hydrogen electrode, SHE). The Nernst equation is applied to account for changes in temperature and chemical activity of species and the Jahn-Teller effect can account for variations in potential due to bonding in the solid-state, but the overall voltage of the cell can be estimated by subtracting $E_a$ (−0.76 V vs. SHE) from the standard redox potential of the active couple of the cathode ($E_c$).

Accordingly, there is a need for improved positive electrode active materials for use in secondary electrochemical cells that use intercalation of zinc ions to store and deliver energy that overcome at least some of the deficiencies of conventional positive electrode active materials.

SUMMARY

A layered electrode material for use in a rechargeable zinc battery is provided herein. The layered electrode material includes a plurality of active metal slab layers in a layered configuration. An active metal slab layer includes a plurality of redox active metal centers, M, and a closely-packed anionic sublattice. The layered electrode material includes a plurality of interlamellar spaces. An interlamellar space separates adjacent active metal slab layers in the layered configuration. The interlamellar space includes at least one pillar species. The layered electrode material has a combined average metal oxidation state in a range of +3 to +4 in an initial charged state. The layered electrode material accepts solvated zinc cations via intercalation into the interlamellar space upon reduction.

At least one of the redox active metal centers may include manganese.

The redox active metal centers may include at least one of chromium, iron, nickel, and cobalt.

The pillar species may include water molecules.
The pillar species may include hydroxide ions.
The pillar species may include an anionic pillar species.
The pillar species may include a cationic pillar species.
The pillar species may include ions of one species.
The pillar species may include ions of multiple distinct species.

The anionic sublattice may include a single layer.
The anionic sublattice may include a plurality of layers.
The anionic sublattice may include an anionic species.
The anionic species may include at least one of an oxide, a sulfide, a fluoride, a hydroxide, a borate, a phosphate, a sulfate, a silicate, and an aluminate.

The anionic species may include a combination of two or more anionic species.

The combination of two or more anionic species may include an oxyhydroxide, an oxyfluoride, or a hydroxysulfate.

The anionic pillar species may include at least one anionic species selected from a group consisting of a nitrate, a sulfate, a carbonate, a phosphate, a borate, a hydroxide, a chloride, an iodide, a perchlorate, and a fluoride.

The cationic pillar species may include at least one cationic species or other ions which include an element selected from a group consisting of hydrogen, ammonium, tetraalkylammonium, alkali metals, alkaline earth metals, d-block metals, and f-block metals.

The pillar species may be covalently bonded to atoms in the active metal slab layer.

Adjacent slab layers may have a d-spacing between 7 angstroms and 20 angstroms.

The layered electrode material may be used in a composite positive electrode for use in a rechargeable zinc battery.

The composite positive electrode may include at least one conductive additive, and at least one binder.

The layered electrode material may be used in a rechargeable zinc battery.

A method of manufacturing a layered electrode material for use in a rechargeable zinc battery is provided herein. The method includes synthesizing a positive electrode active material. The positive electrode active material includes a plurality of active metal slab layers in a layered configuration. An active metal slab layer includes a plurality of redox active metal centers, M, and a closely-packed anionic sublattice. The positive electrode active material includes a plurality of interlamellar spaces. An interlamellar space separates adjacent active metal slab layers in the layered configuration. The interlamellar space includes at least one pillar species. The positive electrode active material has a combined average metal oxidation state in a range of +3 to +4 in an initial charged state. The positive electrode active material accepts solvated zinc cations via intercalation into the interlamellar space upon reduction. The method includes processing the positive electrode active material to increase a d-spacing of the positive electrode active material to between 7 angstroms and 20 angstroms.

The positive electrode active material may be synthesized using a wet chemistry or solid-state process.

The method may include controlling the composition of the active metal slab layers in such a way that the plurality of redox active metal centers include at least one of chromium, manganese, iron, cobalt, and nickel.

The active metal slab layer may include a single layer of an oxide, a sulfide, a fluoride, a hydroxide, a phosphate, a sulfate, a silicate, an aluminate, or any combination of the foregoing species.

The method may include controlling the d-spacing between 7 angstroms and 20 angstroms.

The method may include controlling the composition of the interlamellar space by addition of an anionic pillar species.

The anionic pillar species may be selected from a group consisting of nitrate, sulfate, carbonate, phosphate, borate, hydroxide, chloride, iodide, perchlorate, and fluoride.

The method may include controlling the composition of the interlamellar space by addition of water molecules.

A method of manufacturing a composite positive electrode for use in a rechargeable zinc battery is provided herein. The composite positive electrode includes a current collector. The method includes generating a mixture by homogeneously mixing a layered electrode material, at least one conductive additive, and at least one binder. The layered electrode material includes a plurality of active metal slab layers in a layered configuration. An active metal slab layer includes a plurality of redox active metal centers, M, and a closely-packed anionic sublattice. The layered electrode material includes a plurality of interlamellar spaces. An interlamellar space separates adjacent active metal slab layers in the layered configuration. The interlamellar space includes at least one pillar species. The layered electrode material has a combined average metal oxidation state in a range of +3 to +4 in an initial charged state. The layered electrode material accepts solvated zinc cations via intercalation into the interlamellar space upon reduction. The method includes applying the mixture as a film onto at least one side of a metal substrate of the current collector. The method includes drying or curing the film.

The mixture may be generated by dry mixing.

The mixture may be generated by slurry mixing in a solvent.

The film may be cured or dried by applying heat.

The film may be cured or dried by applying ultraviolet radiation.

The film may be cured or dried by applying a combination of heat and ultraviolet radiation.

The method may include maintaining a d-spacing of the layered electrode material between 7 angstroms and 20 angstroms.

A rechargeable zinc battery is provided herein. The rechargeable zinc battery includes a positive electrode including a layered electrode material. The layered electrode material includes a plurality of active metal slab layers in a layered configuration. An active metal slab layer includes a plurality of redox active metal centers, M, and a closely-packed anionic sublattice. The layered electrode material includes a plurality of interlamellar spaces. An interlamellar space separates adjacent active metal slab layers in the layered configuration. The interlamellar space includes at least one pillar species. The layered electrode material has a combined average metal oxidation state in a range of +3 to +4 in an initial charged state. The layered electrode material accepts solvated zinc cations via intercalation into the interlamellar space upon reduction. The rechargeable zinc battery includes a negative electrode including zinc. The rechargeable zinc battery includes an electrolyte for ionically coupling the negative electrode to the positive electrode. The electrolyte includes a zinc salt dissolved in water. The rechargeable zinc battery includes a separator disposed between the positive electrode and the negative electrode. The separator is wetted by the electrolyte.

The negative electrode may include zinc metal.

The negative electrode may include a zinc alloy.

The electrolyte may include zinc ions in a range from 0.001 molar to 10 molar.

The electrolyte may include zinc ions in a range from 0.1 molar to 4 molar.

The zinc salt may be zinc sulfate, zinc acetate, zinc citrate, zinc iodide, zinc chloride, zinc perchlorate, zinc bis(trifluoromethanesulfonyl)imide, zinc nitrate, zinc phosphate, zinc triflate, zinc tetrafluoroborate, or zinc bromide.

The electrolyte may have a pH value between 1 and 7.

The electrolyte may have a pH value between 4 and 6.

The rechargeable zinc battery may have an average discharge voltage in the range of 1-3 V.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification. In the drawings.

DETAILED DESCRIPTION

Figure 1:
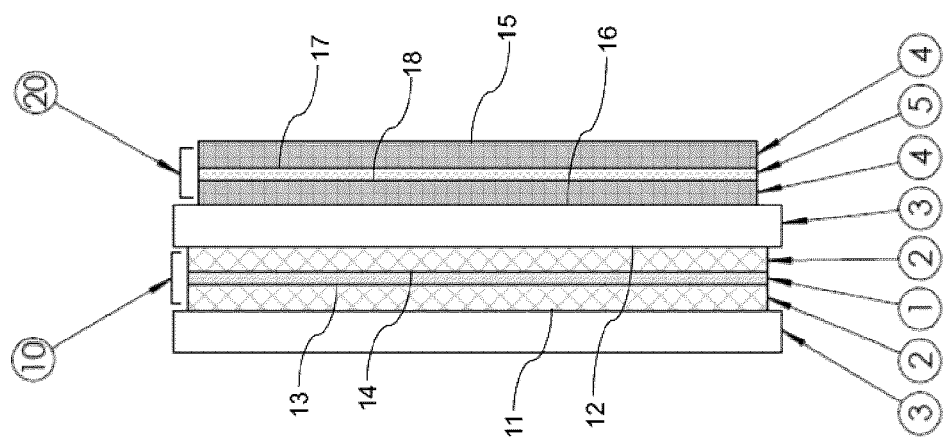
FIG. 1 is a side view of a zinc metal secondary cell, according to an embodiment.

Various apparatuses or processes will be described below to provide an example of each claimed embodiment. No embodiment described below limits any claimed embodiment and any claimed embodiment may cover processes or apparatuses that differ from those described below. The claimed embodiments are not limited to apparatuses or processes having all of the features of any one apparatus or process described below or to features common to multiple or all of the apparatuses described below.

As used herein, the term "about", when used in reference to a pH value, means the pH value given +/−0.5 unless otherwise stated. When the term "about" is used in reference to a pH range, it is understood that the forgoing definition of "about" is to be applied to both the lower limit and upper limit of the range.

As used herein, the term "about", when used in reference to a molar concentration ("molar") value, means the molar value +/−0.1 molar, unless otherwise stated. When the term "about" is used in reference to a molar range, it is understood that the forgoing definition of "about" is to be applied to both the lower limit and upper limit of the range.

As used herein, the term "between", when used in reference to a range of values such as a molar range or a pH range, means the range inclusive of the lower limit value and upper limit value, unless otherwise stated. For example, a pH range of "between 4 to 6" is taken to include pH values of 4.0 and 6.0.

The present disclosure relates generally to improving performance of secondary electrochemical cells that use intercalation of zinc ions within a layered material to store and deliver energy. Intercalation refers to the reversible inclusion or insertion of zinc ions in a crystal structure of the electrode material. Electrode materials disclosed herein are capable of intercalating solvated $Zn^{2+}$ during discharge of a zinc metal battery. The electrode materials may include various transition metals and transition metal oxides. The layered materials may include various design features that improve performance of the zinc battery over conventional zinc batteries. In particular, the layered materials may improve voltage, capacity, charge/discharge rate, and energy efficiency of the zinc battery.

Various transition metals may be used to provide increased voltage as compared to existing zinc metal batteries (e.g. those using vanadium). One example of a transition metal that can increase the voltage of a zinc metal battery compared to vanadium (as used in known cells) is manganese. Various structures of manganese dioxide ($MnO_2$) have been examined in zinc metal batteries in mild (pH 4-6) aqueous electrolytes. In particular, U.S. Pat. No. 6,187,475 to Ahanyang Seung-Mo Oh and Kunpo Sa-Heum Kim describes a zinc-ion battery. The zinc-ion battery includes an electrolytic manganese dioxide positive electrode. In rechargeable Zn‖$MnO_2$ batteries using mild aqueous electrolytes, the $Mn^{4+}$ is reduced to $Mn^{3+}$ during discharge and $Mn^{3+}$ is oxidized back to $Mn^{4+}$ during charge. The average discharge voltage is around 1.4 V. Various proposed mechanisms have been suggested for this reversible reaction including intercalation/deintercalation of $Zn^{2+}$ or $H^+$ from water, and several different conversion reactions resulting in phase transformations of the initial $MnO_2$ phase. Ideally, the structure of a positive electrode of a zinc-ion battery would not be converted to a different phase during cycling of the battery.

The layered materials disclosed herein may include one or more transition metals. The transition metal may be manganese. The layered material may be a hydrated, layered manganese oxide. The hydrated, layered manganese oxide may be chalcophanite ($ZnMn_3O_7 \cdot 3H_2O$) or from the birnessite group. The hydrated, layered manganese oxide may accommodate solvated zinc cations via a reversible intercalation/deintercalation mechanism while maintaining its original layered structure.

The transition metal of the layered material may be nickel, iron, cobalt, or chromium. The transition metal may provide increased voltages in zinc metal batteries. The transition metal includes a basal-plane spacing sufficient to fit or accommodate solvated $Zn^{2+}$ cations. Transition metals nickel, iron, cobalt, and chromium have been used extensively in Li-ion batteries as positive electrode materials (e.g. $LiFePO_4$ (LFP), $LiCoO_2$ (LCO), $LiNi_{0.33}Co_{0.33}Mn_{0.33}O_2$ (NMC), and $LiNi_{0.8}Co_{0.15}Al_{0.05}O_2$ (NCA)), albeit to intercalate/deintercalate $Li^+$ rather than $Zn^{2+}$ and using non-aqueous electrolytes instead of aqueous electrolytes. Of these Li-ion positive electrode materials, LCO, NMC, and NCA are layered structures, but possess basal-plane spacings (4.6 to 4.8 Å) that are too small to fit solvated $Zn^{2+}$ cations.

Referring now to FIG. 1, shown therein is a secondary electrochemical cell 100, according to an embodiment. The cell 100 can be used for the storage and delivery of electrical energy.

The cell 100 may be used in a rechargeable zinc-ion battery. The rechargeable zinc-ion battery may be used for the delivery of electrical energy by the intercalation of solvated zinc ions into the interlayer space of the layered materials disclosed/described herein upon discharge. The rechargeable zinc-ion battery may be used for the storage of electrical energy by the deintercalation of the solvated zinc ions upon charge. The rechargeable zinc-ion battery may have an average discharge voltage in the range of 1-3 V.

The secondary cell 100 includes a zinc metal negative electrode 10, an aqueous electrolyte, a positive electrode 20, and a separator 3.

The negative electrode 10 includes a first face 11 and a second face 12. The negative electrode 10 includes a zinc metal layer 2.

The negative electrode 10 includes a current collector 1 for collecting current. The current collector 1 includes a first face 13 and a second face 14. The zinc metal layer 2 is adhered to the first face 13 and the second face 14 of the current collector 1. The current collector 1 may be an electrically conductive metal foil.

In an embodiment, the negative electrode 10 may be formed using a slurry casting or rolling of a paste or dough containing zinc metal onto a metal foil substrate (current collector 1).

The positive electrode 20 includes a first face 15 and a second face 16.

The positive electrode 20 reacts reversibly with $Zn^{2+}$ cations. The positive electrode 20 includes an active material 4 that electrochemically reacts with $Zn^{2+}$ in the electrolyte in a reversible manner. "Reversible" refers to the ability to recover at least 90% of electrical charge stored in the material upon charging the cell 100.

The active material 4 may be a layered material (for example, layered material 300 of FIG. 3). The active layer 4 may be a hydrated layered active material. The layered material may include a transition metal. The layered material may include a transition metal oxide. The transition metal may be manganese (Mn), chromium (Cr), iron (Fe), nickel (Ni), or cobalt (Co). The layered material may include various design features such as slab layer composition, interlamellar space composition, and d-spacing that improve performance of the zinc battery over conventional zinc batteries. The layered material may improve voltage, capacity, charge/discharge rate, and energy efficiency of the zinc battery 100.

The positive electrode 20 includes a current collector 5 for collecting current. The current collector 5 includes a metal substrate. The current collector 5 includes a first face 17 and a second face 18. The current collector 5 may be coated on the first and second faces 17, 18 with a mixture including an electrochemically active material, a conductive additive, and a binder. The current collector 5 of the positive electrode 20 may be a metal foil.

In an embodiment, the positive electrode 20 may be formed using a slurry casting or rolling of a paste or dough containing active material 4 onto a metal foil substrate (current collector 5).

The aqueous electrolyte ionically couples the negative electrode 10 to the positive electrode 20. The pH of the electrolyte may be between about 1 and 7. The pH of the electrolyte may be between about 4 and 6.

The electrolyte includes a zinc salt dissolved in water. The zinc salt may be dissolved so that zinc ions are present in the electrolyte in a range from about 0.001 molar to 10 molar. The zinc salt may be dissolved so that zinc ions are present in the electrolyte in a range from about 0.1 molar to about 4 molar. The zinc salt may be selected from a group of zinc salts including zinc sulfate, zinc acetate, zinc citrate, zinc iodide, zinc chloride, zinc perchlorate, zinc bis(trifluoromethanesulfonyl)imide, zinc nitrate, zinc phosphate, zinc triflate, zinc tetrafluoroborate, and zinc bromide.

The separator 3 is wetted by the electrolyte. The separator 3 is positioned in the cell 100 such that the separator 3 prevents the negative electrode 10 and positive electrode 20 from making physical contact with each other. The separator may be disposed between the negative electrode 10 and the positive electrode 20. The separator 3 may be porous.

In an embodiment, the cell 100 includes a thin film electrode stack configuration where the negative electrode 10 includes a current collector 1 which is coated on both sides by a layer of zinc metal 2, the separator 3 which is soaked in electrolyte and prevents the negative electrode 10 and positive electrode 20 from contacting each other, and the positive electrode 20 which includes an active layer 4 which is coated on both sides of the current collector 5.

Figure 2:
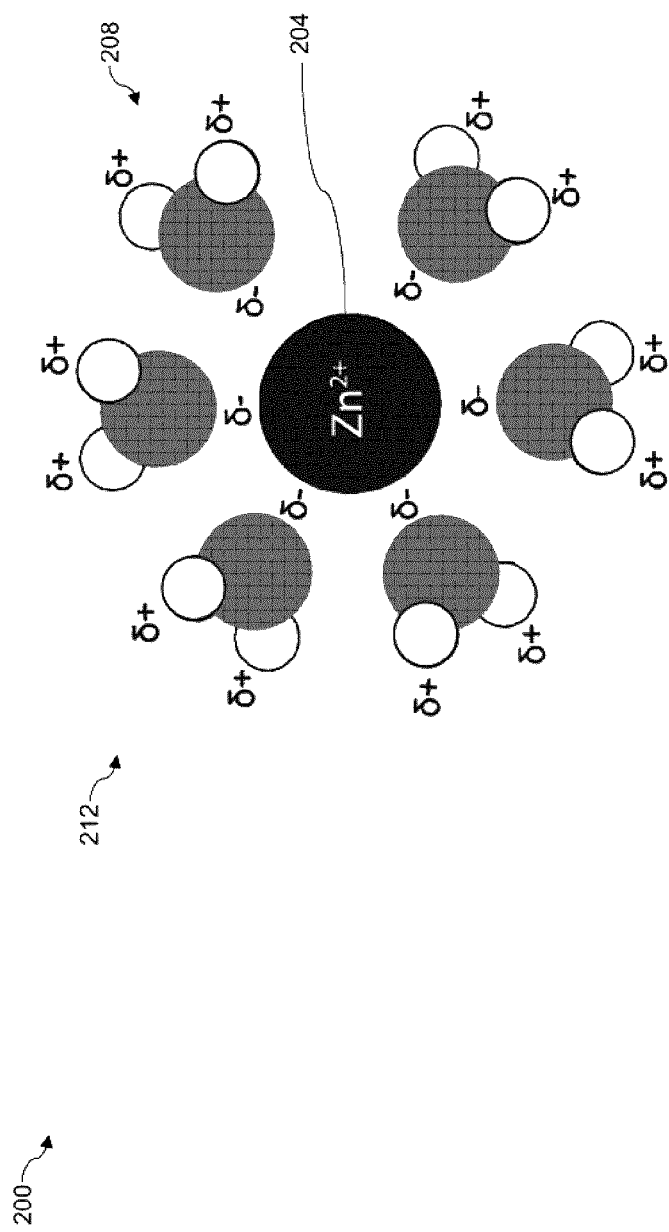
FIG. 2 is a diagrammatic representation of solvation of a zinc cation, according to an embodiment.

Referring now to FIG. 2, shown therein is a diagrammatic representation 200 of solvation of a zinc cation, according to an embodiment.

A zinc cation 204 is solvated with a shell of six water molecules 208 in an octahedral configuration to produce a solvated zinc cation 212. The total solvated zinc cation 212 is the predominant form under which zinc is present in a mildly acidic electrolyte. One requirement for zinc-ion batteries (e.g. cell 100 of FIG. 1) that differs from previous intercalation batteries (e.g. lithium-ion) is a need for interlayer water molecules or another solvent shell surrounding the zinc cation. This is because zinc ions are divalent (i.e. have a 2+ charge). The high charge density causes the zinc ion to tightly bind water or other solvent molecules from the electrolyte such that it is surrounded by a solvent shell, as shown in FIG. 2. For the zinc ion to travel through the electrode material it needs to be able to carry the solvent shell with the zinc ion to the reaction site.

Figure 3A:
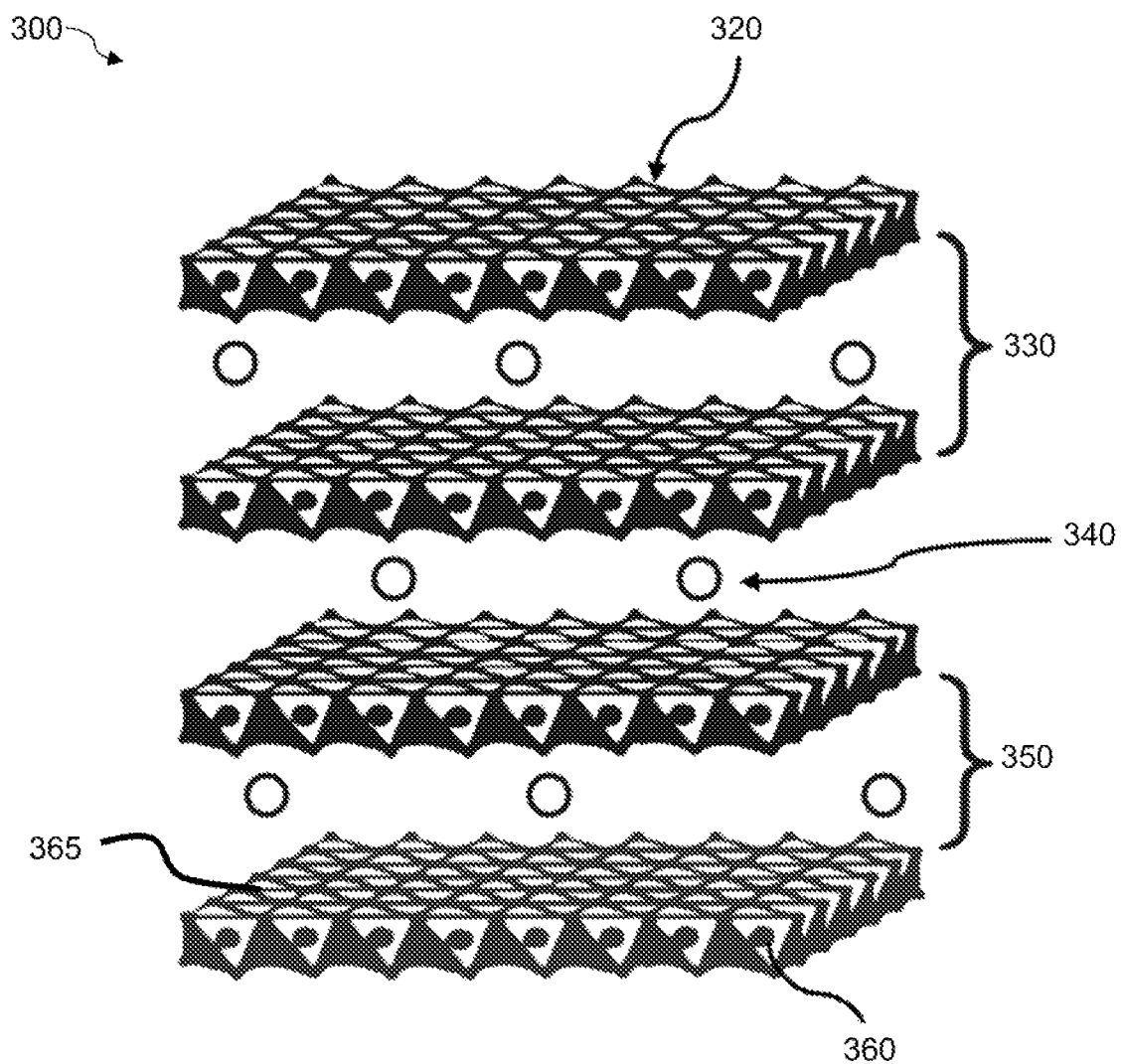
FIG. 3A is a crystal structure representation of a layered electrode material, according to an embodiment.

Referring now to FIG. 3A, shown therein is a layered electrode material 300 for use in a rechargeable zinc battery, according to an embodiment. The layered material 300 may form part of a positive electrode of the zinc battery (e.g. active layer 4 of positive electrode 20 of battery 100 of FIG. 1). The layered material 300 may improve one or more properties of the battery, such as voltage, capacity, the rate at which the battery can be charged/discharged, and energy efficiency.

The layered electrode material 300 includes a plurality of closely-packed redox active metal slab layers 320. The active metal slab layers 320 each include a plurality of redox active metal centers 360, M, in a close-packed anionic sublattice 365.

The active metal slab layer 320 includes a closely-packed anionic sublattice. The anionic sublattice may comprise a single layer or a plurality of layers. The anionic sublattice may comprise a anionic species. The anionic species may include one or more of an oxide, a sulfide, a fluoride, a hydroxide, a borate, a phosphate, a sulfate, a silicate, an aluminate, or the like. The anionic species may include a combination of two or more anionic species. For example, the combination of two or more anionic species may include an oxyhydroxide, an oxyfluoride, a hydroxysulfate, or the like.

Adjacent slab layers 320 are separated by an interlamellar space 350. The interlamellar space 350 is occupied by one or more pillar species 340. The pillar species 340 impact a distance between the active metal slabs 320, typically referred to as basal plane spacing or d-space 330. The d-spacing 330 is defined as the sum of the height of the interlamellar space 350 and the height of one slab layer 320.

The layered material 300 may have a d-spacing ranging from 7 angstroms to 20 angstroms. The layered electrode material 300 accepts solvated zinc cations via intercalation into the interlamellar space 350 upon reduction.

The pillar species 340 may include one or more of water molecules, hydroxide ions, an anionic species (anionic pillar species), a cationic species (cationic pillar species), or ions of one or multiple distinct species.

The anionic pillar species may include one or more of a nitrate, a sulfate, a carbonate, a phosphate, a borate, a hydroxide, a chloride, an iodide, a perchlorate, a fluoride, or the like.

The cationic pillar species may include one or more cationic species or other ions which include an element taken from a group including hydrogen, ammonium, tetraalkylammonium, alkali metals, alkaline earth metals, d-block metals, and f-block metals.

The pillar species 340 may be covalently bonded to atoms in the active metal slab layer 320.

In particular, the layered material 300 may be a hydrated layered material (i.e. with water molecules in between the slab layers 320). The hydrated layered material (water molecules in between slab layers 320) may be an effective host for reversible zinc intercalation.

Hydrated layered materials 300 may have a d-space 330 ranging from 7 angstroms to 20 angstroms. A layered material 300 including a monolayer of water may have a d-space 330 of approximately 7 angstroms. The presence of water and/or ions between the active slab layers 320 may create enough space for reversible zinc intercalation to occur. The d-spaces 330 for hydrated layered materials may range from 7 to 20 Å.

The layered material 300 may be used as an active material of a positive electrode (e.g. active material 4 of FIG. 1). The layered material 300 may include a transition metal or a transition metal oxide. The layered material 300 may include various design features such as slab layer composition, interlamellar space composition, and d-spacing that improve performance of the zinc battery over conventional zinc batteries. The layered material 300 may improve voltage, capacity, charge/discharge rate, and energy efficiency of the zinc battery.

The layered material 300 may include one or more transition metals. The layered material 300 may include manganese. The layered material may be a hydrated, layered manganese oxide. The hydrated, layered manganese oxide may be chalcophanite ($ZnMn_3O_7 \cdot 3H_2O$) or from the birnessite group. The hydrated, layered manganese oxide may accommodate solvated zinc cations via a reversible intercalation/deintercalation mechanism while maintaining the original layered structure. The layered material 100 may be selected, composed, or designed such that the layered material 100 (and thus the positive electrode) is not converted to a different phase during cycling of the battery. The transition metal of the layered material 100 may be nickel, iron, cobalt, or chromium.

The transition metal may provide increased voltages in zinc metal batteries. The transition metal includes a basal-plane spacing sufficient to fit or accommodate solvated $Zn^{2+}$ cations. Transition metals which may provide increased voltages in zinc metal batteries include nickel, iron, cobalt, and chromium.

Figure 3B:
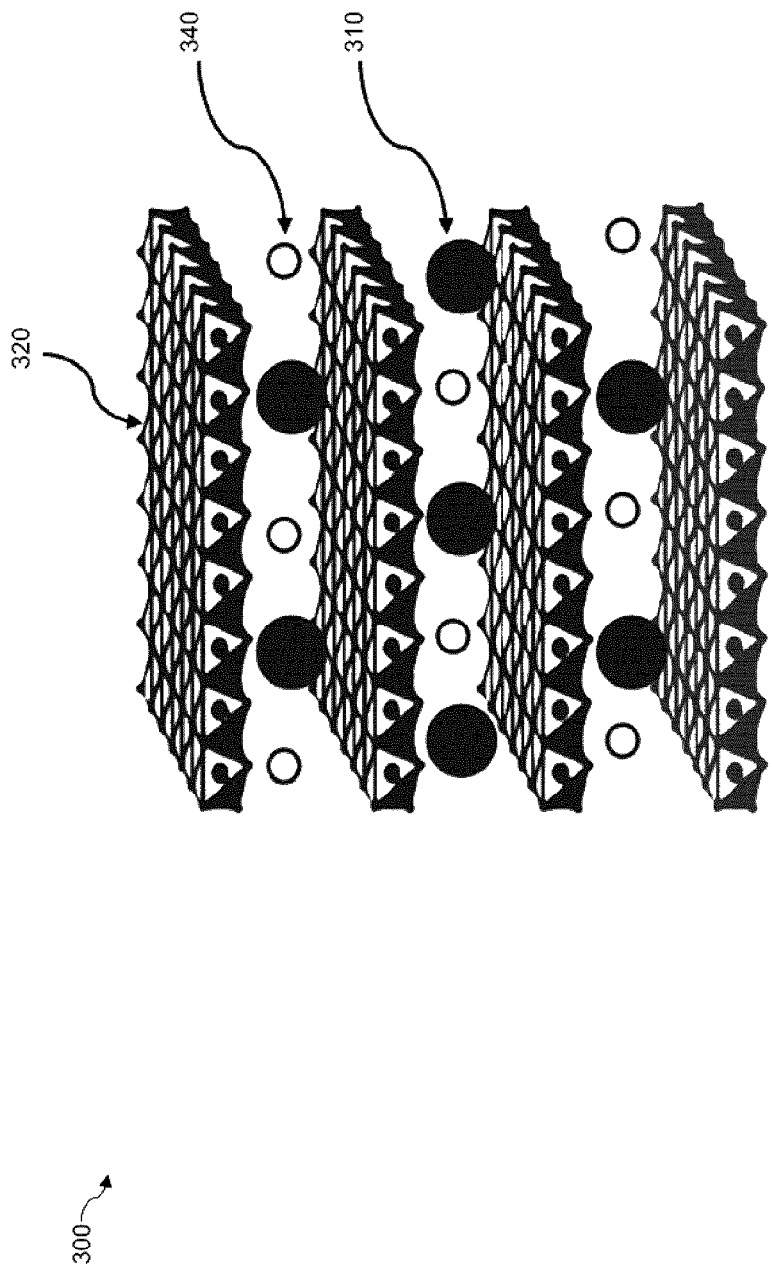
FIG. 3B is a crystal structure representation of the layered electrode material of FIG. 3A after zinc intercalation, according to an embodiment.

Referring now to FIG. 3B, shown therein is the layered material 300 of FIG. 3A after intercalation of solvated $Zn^{2+}$ 310 in the interlamellar space 350, according to an embodiment. In addition to the pillar species 340, the interlamellar space 350 includes intercalated zinc ions.

The intercalation of solvated $Zn^{2+}$ 310 occurs in concomitance with a reduction of the redox active metal centers 360 in the active metal slab layers 320. The reduction of the redox active metal centers 360 may include a reduction from $M^{5+}$ to $M^{4+}$, $M^{4+}$ to $M^{3+}$, or $M^{3+}$ to $M^{2+}$ (where M is the active metal center 360).

The intercalation/deintercalation of the solvated $Zn^{2+}$ into/from the layered material 100 may have very fast kinetics. The very fast kinetics may be attributed to a large d-spacing 330 of the layered material 300. U.S. Pat. No. 9,780,412 to Adams et. al. suggests very fast kinetics for the intercalation/deintercalation of solvated $Zn^{2+}$ into/from the layered compound is attributed to the large d-spacing of 10.8 angstroms for $Zn_{0.25}V_2O_5 \cdot nH_2O$ in a zinc battery incorporating vanadium.

Intercalation in the layered material 300 requires zinc ions 310 to diffuse through the electrode material (e.g. active material 4 of FIG. 1, layered material 300) to reach a redox active metal center 360. Compared to crystal structures characterized by a three-dimensional interstitial network for guest ions (e.g, EMD as shown in FIG. 4), the layered material 300 may provide a simpler, unimpeded path for zinc ions 310 to travel along and through the electrode material to reach the active metal center 360.

Figure 4:
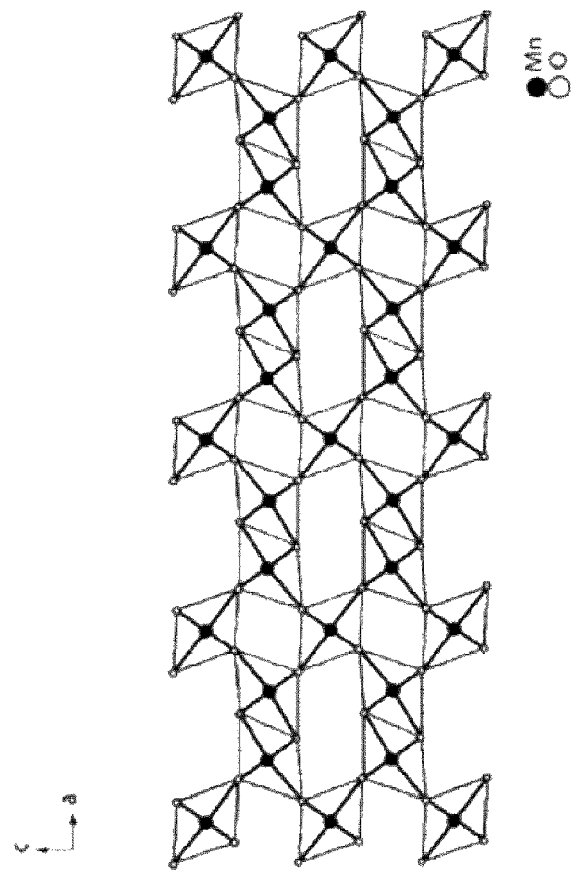
FIG. 4 is a crystal structure representation of electrolytic manganese dioxide.
Figure 5:
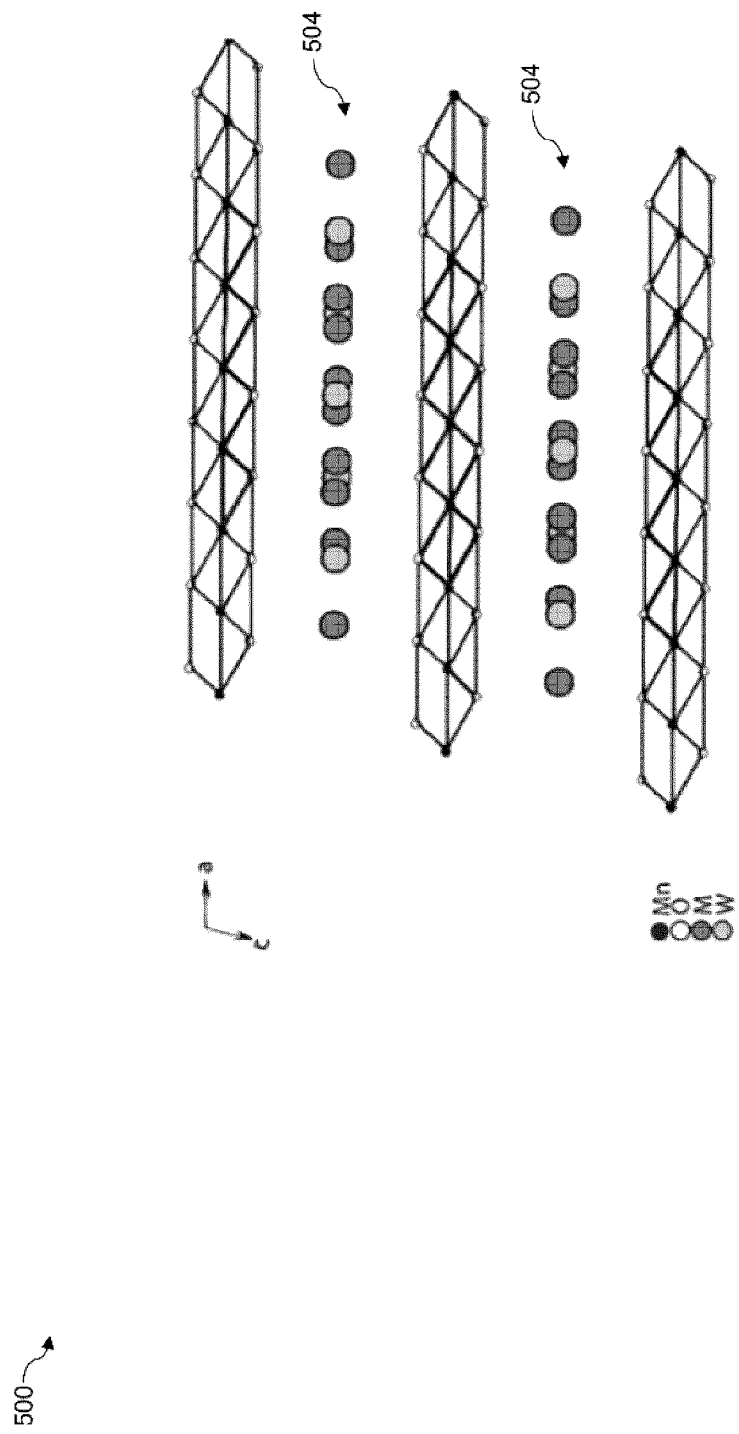
FIG. 5 is a crystal structure representation of a layered electrode material comprising birnessite, according to an embodiment.
Figure 6:
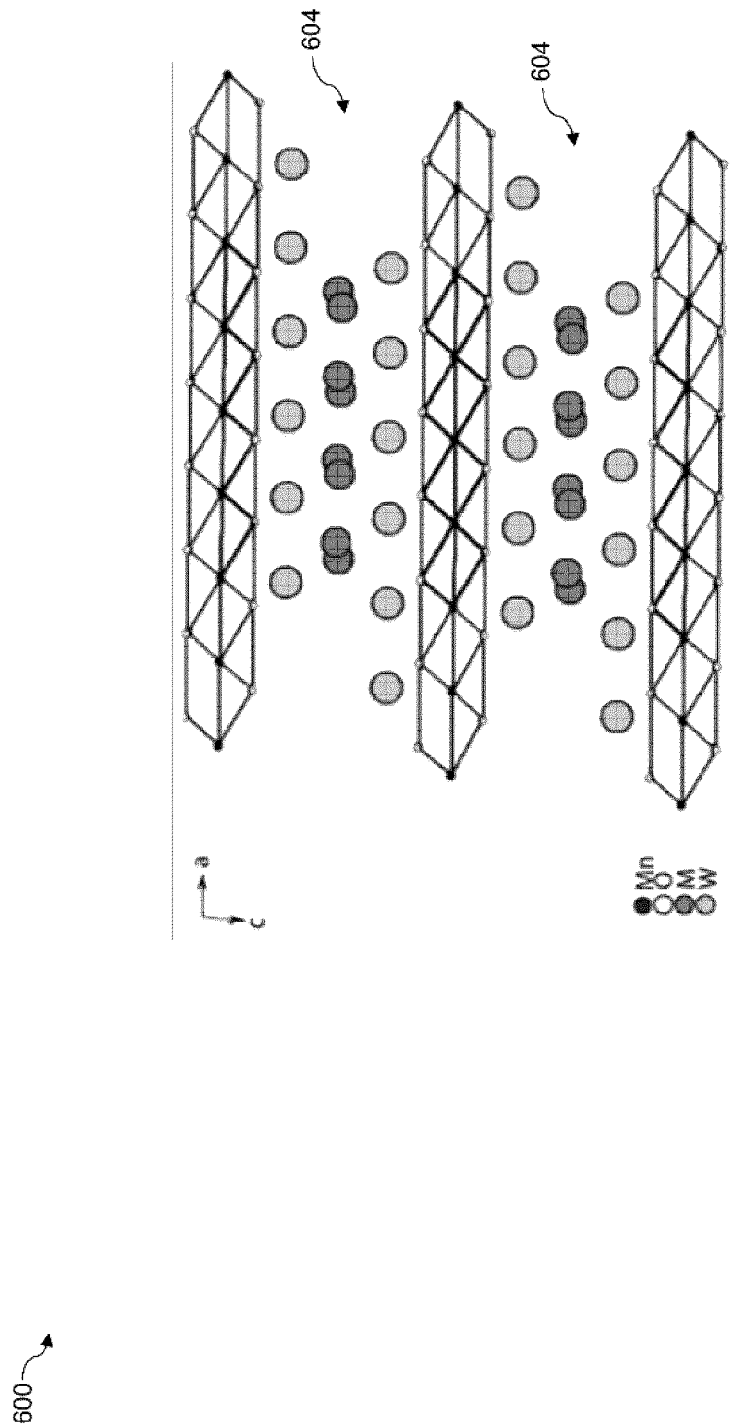
FIG. 6 is a crystal structure representation of a layered electrode material comprising buserite, according to an embodiment.

Example $MnO_2$ structures are illustrated in FIGS. 4 to 6. Various $MnO_2$ compounds may be suitable for use in layered material 300. $MnO_2$ compounds may be capable of intercalating zinc ions.

Referring now to FIG. 4, shown therein is a structural representation of electrolytic manganese dioxide (EMD) 400. EMD 400 is an example of a crystal structure characterized by a three-dimensional interstitial network for guest ions. EMD 400 is a mixture of $\gamma$-$MnO_2$ and $\varepsilon$-$MnO_2$. EMD 400 includes 1×1 and 1×2 intercalation tunnels. $Zn^{2+}$ diffusion is difficult in the 1×2 or even 1×1 intercalation tunnels of EMD 400. The difficulty of $Zn^{2+}$ diffusion suggests tunneled EMD (and similarly structured compounds) may be less suitable for use in a rechargeable zinc battery than layered material 300.

Referring now to FIGS. 5 and 6, shown therein are structural representations of birnessite-type manganese oxides $\delta$-$MnO_2$. In an embodiment, the layered intercalation material 300 includes a birnessite-type manganese oxide $\delta$-$MnO_2$ such as birnessite (shown in FIG. 5) or buserite (shown in FIG. 6). The interlamellar space (e.g. interlamellar space 350 of FIG. 3) of the birnessite-type manganese oxide may include one or more layers of water. The one or more layers of water may contribute to the ability of the birnessite-type manganese oxide to accommodate zinc ions 310 through intercalation.

Referring specifically to FIG. 5, shown therein is a structural representation of birnessite 500. $Zn^{2+}$ diffusion is facile in the 1×∞ intercalation planes of birnessite 500. Birnessite 500 includes a monolayer of water 504 in the interlamellar space 350, called a monolayer hydrate (MLH) material. Birnessite 500 may have a d-spacing 330 of approximately 7 Å.

Referring now to FIG. 6, shown therein is a structural representation of buserite 600. $Zn^{2+}$ diffusion is facile in the 2×∞ intercalation planes of buserite 600 (even more so than in birnessite 500). Buserite 600 includes a bilayer of water 604 in the interlamellar space, called a bilayer hydrate (BLH) material. Buserite 600 may have a d-spacing (e.g. d-spacing 330 of FIG. 3) of approximately 10 Å.

The difference in d-spacing between birnessite 500 and buserite 600 can be attributed to the monolayer of water 504 and bilayer of water 604, respectively. A wider interlamellar space may provide a lower energy barrier for $Zn^{2+}$ to diffuse in the solid. Accordingly, layered materials such as birnessite 500 and buserite 600 that are swollen by water may be particularly suitable material types for use in zinc-ion batteries (due to an ability to accommodate solvated zinc intercalation).

In another embodiment, the layered material is a nickel oxyhydroxide. In a particular embodiment, the nickel oxyhydroxide may be an γ-NiOOH.

β-Ni(OH)$_2$/β-NiOOH can be used as the positive electrode active material in nickel-metal-hydride, nickel-cadmium, and nickel-zinc batteries. The layered structure of the β-Ni$^{2+}$ and β-Ni$^{3+}$ phases comprises of brucite-type slabs well-ordered along a c-axis. In rechargeable batteries using alkaline electrolytes, this phase reversibly cycles by intercalation/deintercalation of $H^+$.

α-Ni(OH)$_2$/γ-NiOOH structures have similar stacking of brucite slabs (i.e. acting as active slab layers 320) as in β-Ni(OH)$_2$/β-NiOOH, but with water molecules and anionic species occupying the interlamellar space 350. Upon standing in alkaline media, α-Ni(OH)$_2$/γ-NiOOH reverts to β-phase, which is the thermodynamically stable phase.

α-Ni(OH)$_2$/γ-NiOOH can be stabilized by substituting trivalent cations into the slab layers 320 and anions in the interlamellar space 350 which compensate for an excess positive charge in the slabs 320. The γ-Ni$^{3+}$ oxyhydroxide may accommodate solvated $Zn^{2+}$ due to an increased d-spacing 330 compared to the β-Ni$^{3+}$ oxyhydroxide.

Figure 7:
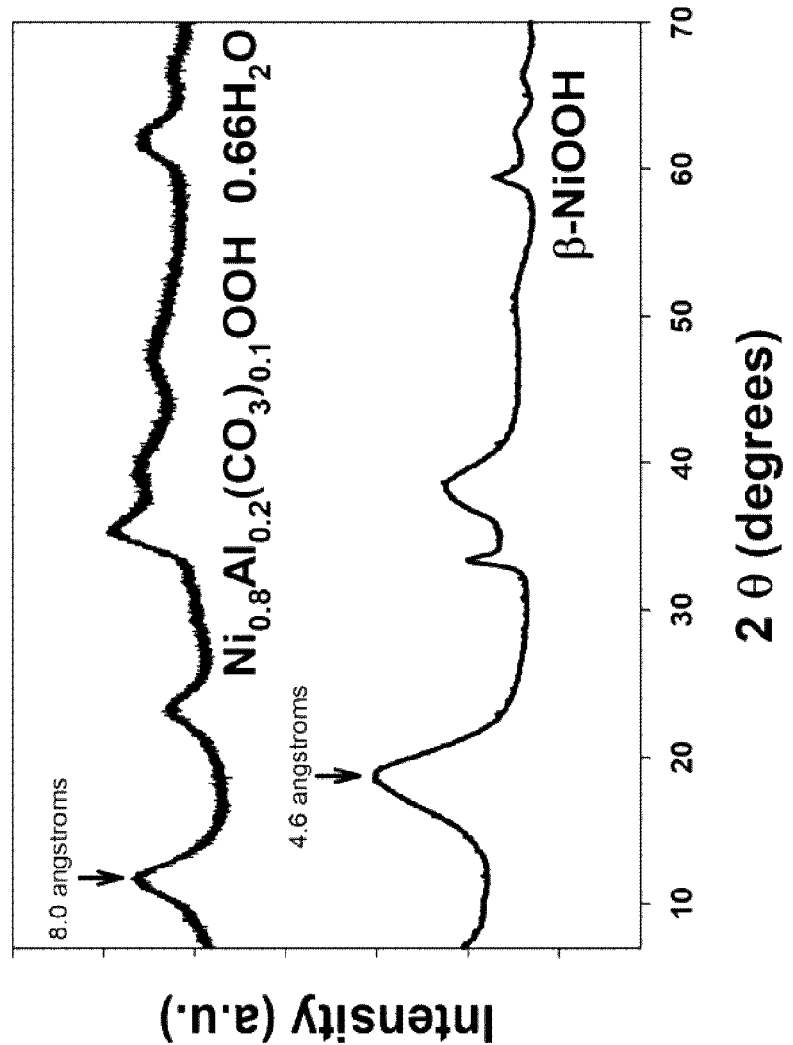
FIG. 7 is a graph illustrating X-ray diffraction (XRD) patterns for layered β-NiOOH and an aluminum-stabilized, hydrated layered γ-phase of NiOOH ($Ni_{0.8}Al_{0.2}(CO_3)_{0.1}OOH \cdot 0.66H_2O$), according to an embodiment.

Referring now to FIG. 7, shown therein is a graph 700 illustrating X-ray diffraction (XRD) patterns for β-NiOOH and stabilized γ-NiOOH, having the formula: $Ni_{0.8}Al0.2(CO_3)_{0.1}OOH \cdot 0.66H_2O$. The $Ni_{0.8}Al0.2(CO_3)_{0.1}OOH \cdot 0.66H_2O$ is an aluminum-stabilized, hydrated layered γ-phase of NiOOH. The d-spacing 330 is increased from 4.6 Å for β-NiOOH to 8.0 Å for $γ-Ni_{0.8}Al0.2(CO_3)_{0.1}OOH \cdot 0.66H_2O$.

In an embodiment, the layered intercalation material 300 is a birnessite-type manganese oxide having a general formula $A_xMn^{3-4+}O_2 \cdot nH_2O$. The interlamellar space 350 of the birnessite-type manganese oxide may comprise one or more monovalent or divalent cationic species, A.

A may be selected specifically to increase the height of the interlamellar space 350. For example, small alkali and alkaline earth cations such as $Na^+$, $K^+$, or $Ca^{2+}$ present in natural birnessite minerals may be substituted by bulkier tetraalkylammonium cations, such as tetramethylammonium ($TMA^+$) or tetrabutylammonium ($TBA^+$).

Figure 8:
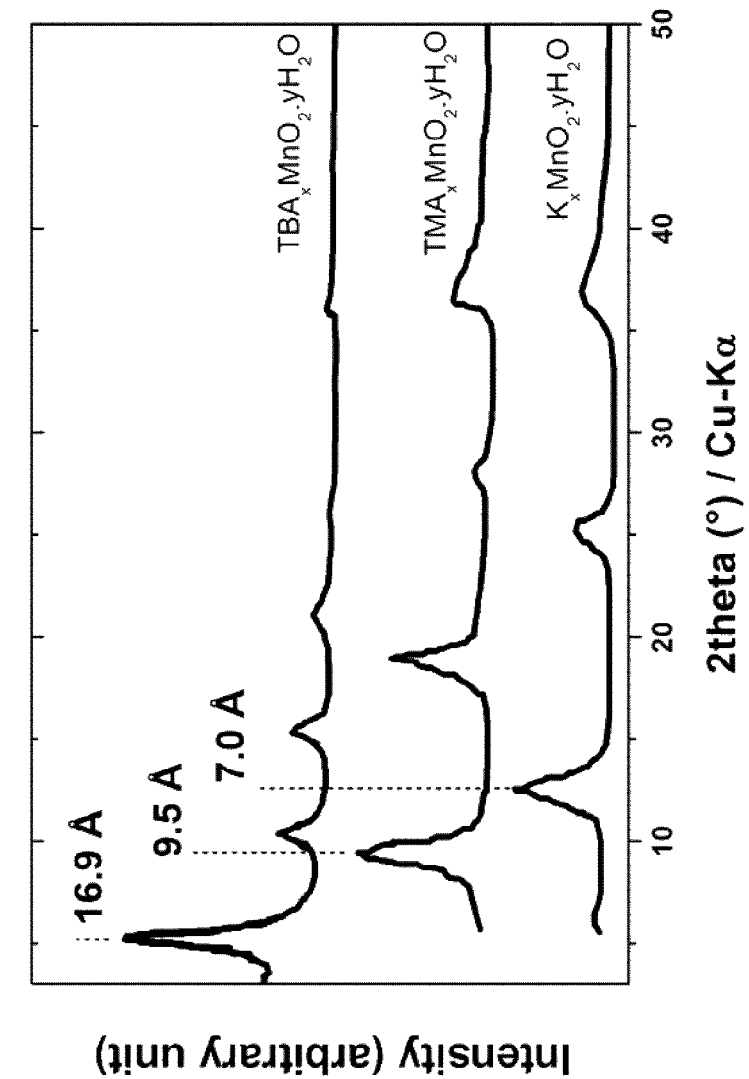
FIG. 8 is a graph illustrating X-ray diffraction (XRD) patterns for synthetic layered hydrate δ-phases of $MnO_2$, of general formula $A_{0.2}MnO_2 \cdot 1.2H_2O$ wherein the cationic pillar species $A^+$ is either potassium, tetramethylammonium or tetrabutylammonium, according to an embodiment.

Referring now to FIG. 8, shown therein is a graph 800 illustrating X-ray diffraction (XRD) patterns for synthetic layered hydrate δ-phases of $MnO_2$, of general formula $A_{0.2}MnO_2 1.2H_2O$ wherein the cationic pillar species $A_+$ is either potassium, tetramethylammonium or tetrabutylammonium, according to an embodiment. The birnessite-type manganese oxide may include substituted bulkier tetraalkylammonium cations.

As illustrated in graph 600, the substitution of $K^+$ by $TMA^+$ and $TBA^+$ results in a d-spacing 330 increase from 7.0 Å to 9.5 Å for $TMA^+$, and from 7.0 Å to 16.9 Å for $TBA^+$, while maintaining the integrity of the redox active slabs 320 and the mean oxidation state of manganese (about +3.8).

The electrode is for use in an electrochemical device (e.g. cell 100 of FIG. 1). The electrode made from the layered materials disclosed herein may be a positive electrode. The electrochemical device includes a positive electrode, a negative electrode, and an aqueous electrolyte. The aqueous electrolyte may be any mildly acidic (pH 4 to 7). The aqueous electrolyte may be an otherwise suitable electrolyte known in the art. The electrochemical device is a zinc rechargeable battery. The positive electrode includes a hydrated layered material as described herein (for example, layered material 300 of FIG. 3). The negative electrode may be zinc, a zinc alloy, or a mixture of any two or more such materials. The electrochemical device may include a separator for separating the negative and positive electrodes. The separator may be a porous separator.

Figure 9:
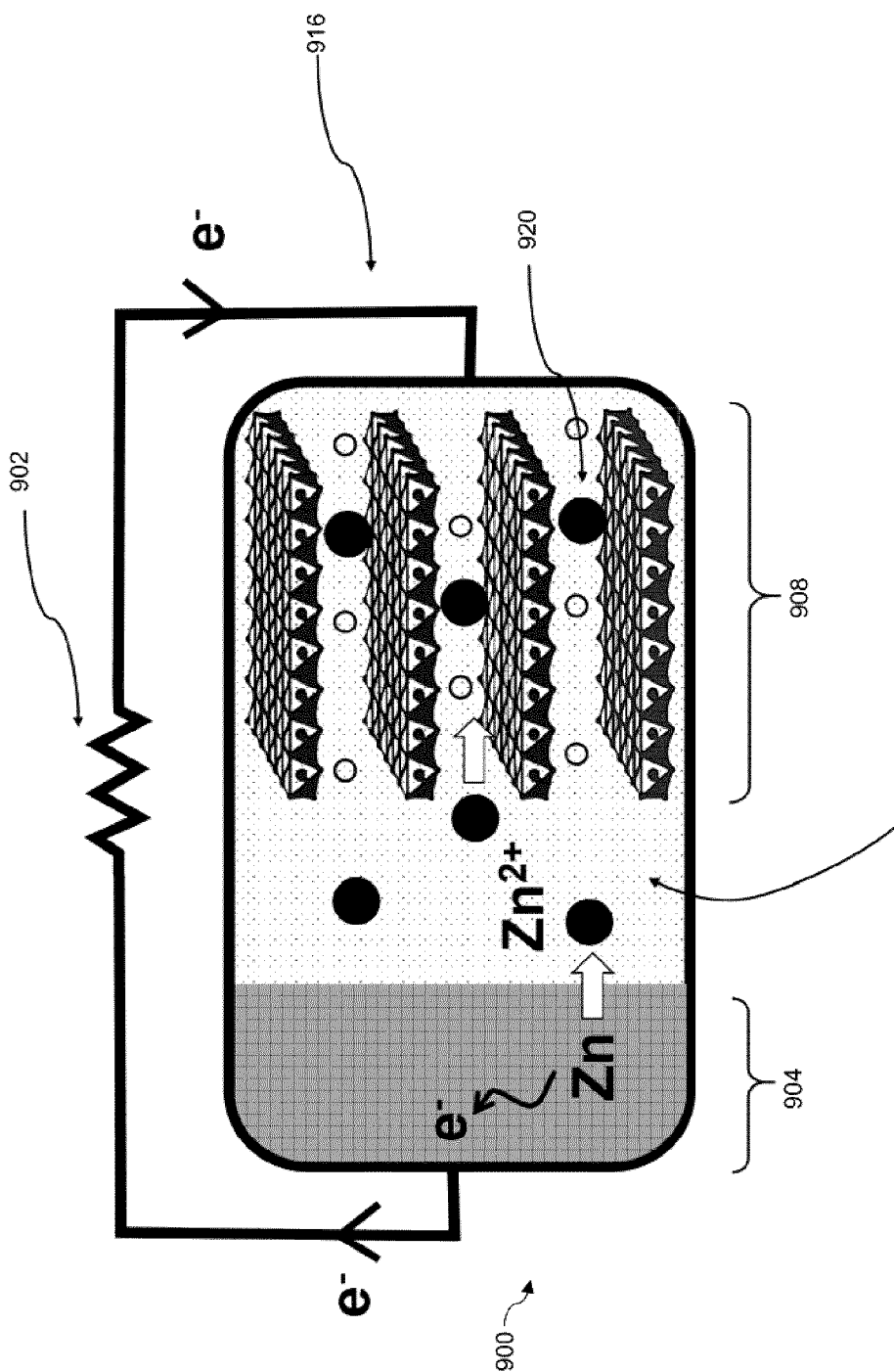
FIG. 9 is a is a schematic diagram of a zinc battery, according to an embodiment.

Referring now to FIG. 9, shown therein is a zinc metal battery 900, according to an embodiment. The zinc battery 900 is shown during discharge under an electrical load 902.

The battery 900 includes a negative electrode 904, a positive electrode 908, an electrolyte 912, and an external circuit 916. During discharge, the external circuit 916 delivers power to an electrical load 902. Electrons are supplied from the oxidation of zinc metal from the negative electrode 904 into zinc cations 920. These zinc cations 920 solvate and migrate through the electrolyte 912 to intercalate in the interlamellar space of the positive electrode active material of the positive electrode 908.

The negative electrode 904 includes zinc. The negative electrode 904 may be formed substantially of zinc metal. The negative electrode 904 may be formed substantially of a zinc alloy. The negative electrode 904 may be a mixture of zinc metal and zinc alloy.

The positive electrode 908 includes a layered material (e.g. layered material 300 of FIG. 3). The layered material comprises an active material (e.g. active material 4 of FIG. 1). The layered material comprises a plurality of active metal slab layers (e.g. active metal slab layer 320 of FIG. 3).

The electrolyte 912 ionically couples the negative electrode 904 to the positive electrode 908. The electrolyte 912 includes a zinc salt dissolved in water. The salt may be dissolved so that zinc ions are present in the electrolyte 912 in a range from about 0.001 molar to 10 molar. The zinc salt may be dissolved so that zinc ions are present in the electrolyte 912 in a range from about 0.1 molar to 4 molar. The zinc salt may be selected from a group including zinc sulfate, zinc acetate, zinc citrate, zinc iodide, zinc chloride, zinc perchlorate, zinc bis(trifluoromethanesulfonyl)imide, zinc nitrate, zinc phosphate, zinc triflate, zinc tetrafluoroborate, and zinc bromide. The pH of the electrolyte 912 may be between 1 and 7. The pH of the electrolyte 912 may be between 4 and 6.

At the negative electrode 904, zinc metal is oxidized into $Zn^{2+}$ cations (e.g. zinc cation 204 of FIG. 2). The $Zn^{2+}$ cations solvate into the electrolyte 912.

At the positive electrode 908 redox active metal centers, M, (for example, redox metal centers 360 of FIG. 3) of the active metal slabs are reduced from $M^{5+}$ to $M^{4+}$, $M^{4+}$ to $M^{3+}$, or $M^{3+}$ to $M^{2+}$ by electrons transported through the external circuit 916.

Solvated zinc cations 210 are intercalated into the interlamellar space 350 between the slab layers 320. In a rechargeable zinc metal battery, the oxidation of zinc metal (also referred to as stripping) and the $Zn^{2+}$ intercalation are fully reversible. Upon charge, solvated $Zn^{2+}$ ions are deintercalated from the positive electrode material 908, diffuse through the electrolyte 912, and are reduced to zinc metal (also referred to as plating).

Figure 10:
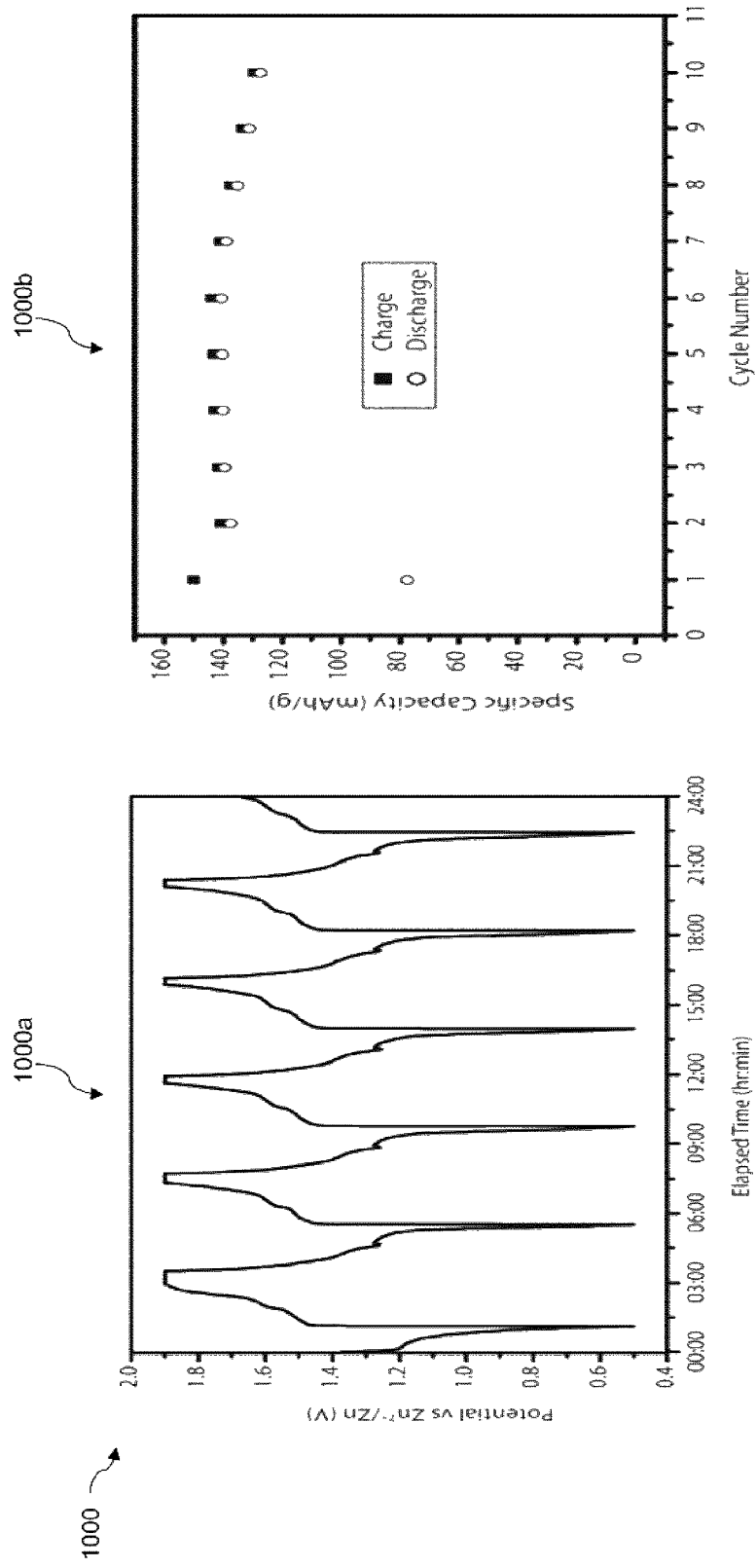
FIG. 10 is a graph illustrating galvanostatic cycling of a zinc metal battery using birnessite as the positive electrode material, including a charge/discharge voltage response over time and an evolution of specific capacity over cycle number, according to an embodiment.

Referring now to FIG. 10, shown therein is a graph 1000 illustrating galvanostatic cycling of a zinc metal battery, according to an embodiment. The zinc metal battery may be zinc battery 400 of FIG. 9. The zinc metal battery comprises a zinc foil negative electrode, 1 M $ZnSO_4$+0.1 M $MnSO_4$ in water electrolyte, and a zinc birnessite/buserite ($Zn_xMnO_2 \cdot nH_2O$) compound as the positive electrode active material is shown. The graph 1000 includes a first panel 1000a illustrating a discharge/charge voltage response over time, and a second panel 1000b illustrating an evolution of specific capacity over cycle number.

The exact composition of the zinc birnessite/buserite material is unknown since buserite (BLH) is a thermodynamically unstable compound which dehydrates to birnessite (MLH). Drying of the electrodes is likely to convert the material to birnessite prior to assembling the cell and re-soaking in the aqueous electrolyte. It is unclear whether the buserite BLH phase re-forms after the cell is assembled and injected with electrolyte. Regardless, the birnessite/buserite cycles well in the zinc cell with an average discharge voltage of 1.4 V and a specific capacity of approximately 140 mAh/g.

The layered materials of the present disclosure (e.g. layered material 300 of FIG. 3) and methods of manufacture thereof may utilize targeted chemical composition.

In an embodiment, the targeted chemical composition is $K_{0.22}Ni_{1/3}Mn_{1/3}Co_{1/3}O_2 \cdot nH_2O$. The mixture of Ni, Mn and Co in the active slab layers (e.g. active slab layers 320 of FIG. 3) follows design considerations for active materials used as positive electrodes in lithium ion rechargeable batteries ($LiNi_{1/3}Mn_{1/3}Co_{1/3}O_2$, NMC). The composition of the interlamellar space (e.g. interlamellar space 350 of FIG. 3), however, is tailored for use in zinc metal batteries.

Figure 11A:
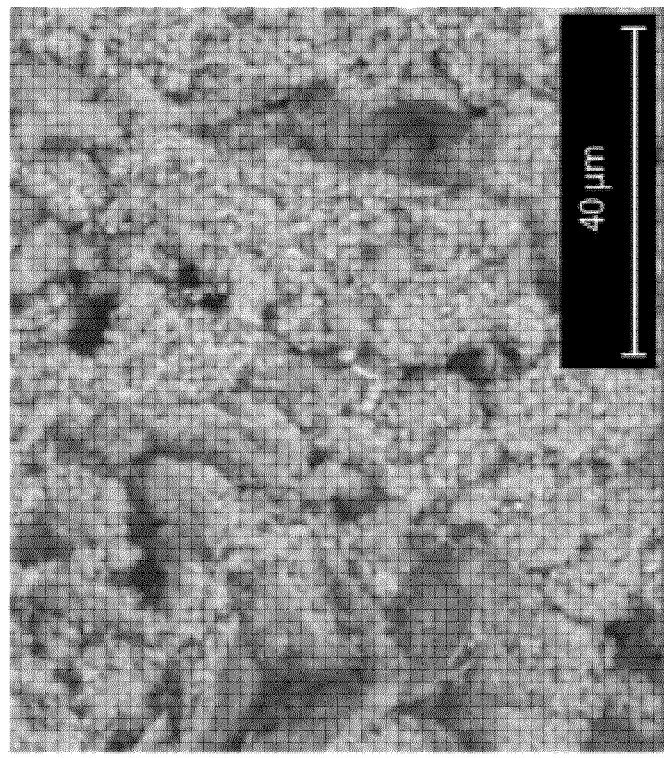
FIG. 11A is a scanning electron microscope image for a hydrated layered $K_{0.26}Ni_{1/3}Mn_{1/3}Co_{1/3}O_2 \cdot nH_2O$ synthesized from $LiNi_{1/3}Mn_{1/3}Co_{1/3}O_2$, according to an embodiment.

Referring now to FIG. 11A, shown therein is a scanning electron microscope (SEM) image 1100a of a synthesized $K_{0.22}Ni_{1/3}Mn_{1/3}Co_{1/3}O_2 \cdot H_2O$ material. The $K_{0.22}Ni_{1/3}Mn_{1/3}Co_{1/3}O_2 \cdot nH_2O$ material is a hydrated, layered material. The $K_{0.22}Ni_{1/3}Mn_{1/3}Co_{1/3}O_2 \cdot nH_2O$ material can be synthesized from $LiNi_{1/3}Mn_{1/3}Co_{1/3}O_2$. The powder comprises very small particles agglomerated together.

Figure 11B:
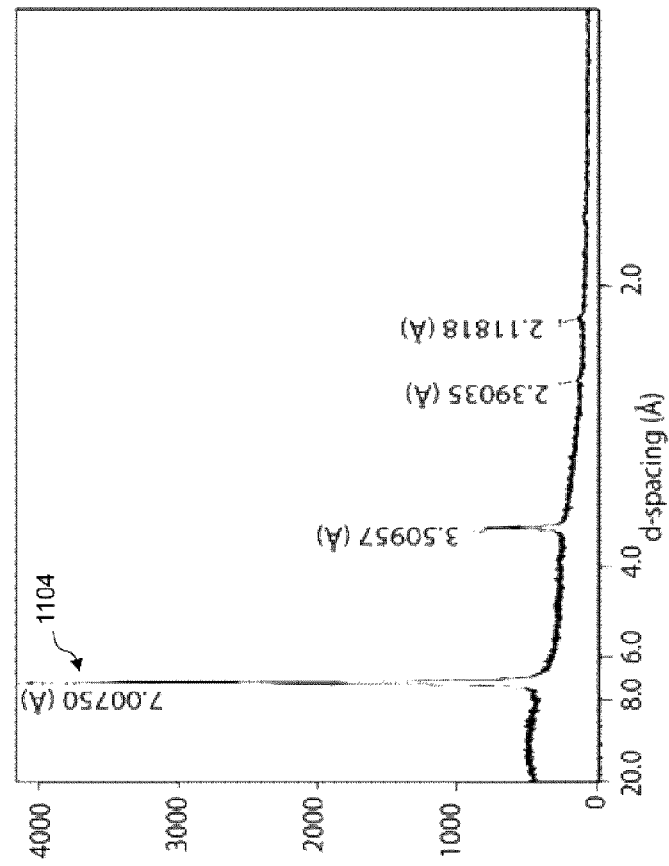
FIG. 11B is a graph illustrating n X-ray diffraction pattern for a hydrated layered $K_{0.26}Ni_{1/3}Mn_{1/3}Co_{1/3}O_2 \cdot nH_2O$ synthesized from $LiNi_{1/3}Mn_{1/3}Co_{1/3}O_2$, according to an embodiment.

Referring now to FIG. 11B, shown therein is an XRD pattern 1100b for the synthesized $K_{0.22}Ni_{1/3}Mn_{1/3}Co_{1/3}O_2 \cdot nH_2O$ of FIG. 11A.

The sharp peak 1104 with greatest intensity at 7.0 Å is associated with the basal plane spacing 330 for $K_{0.22}Ni_{1/3}Mn_{1/3}Co_{1/3}O_2 \cdot nH_2O$. The interlamellar space of $K_{0.22}Ni_{1/3}Mn_{1/3}Co_{1/3}O_2 \cdot nH_2O$ contains $K^+$ cations and water molecules. The stoichiometry of $K^+$ between the active slab layers was identified by energy dispersive X-ray spectroscopy (EDX) during the SEM analysis. The introduction of $K^+$ and $H_2O$ increased the height of the interlamellar space by 2.24 Å relative to the starting NMC material (d-spacing=4.76 Å).

Figure 12:
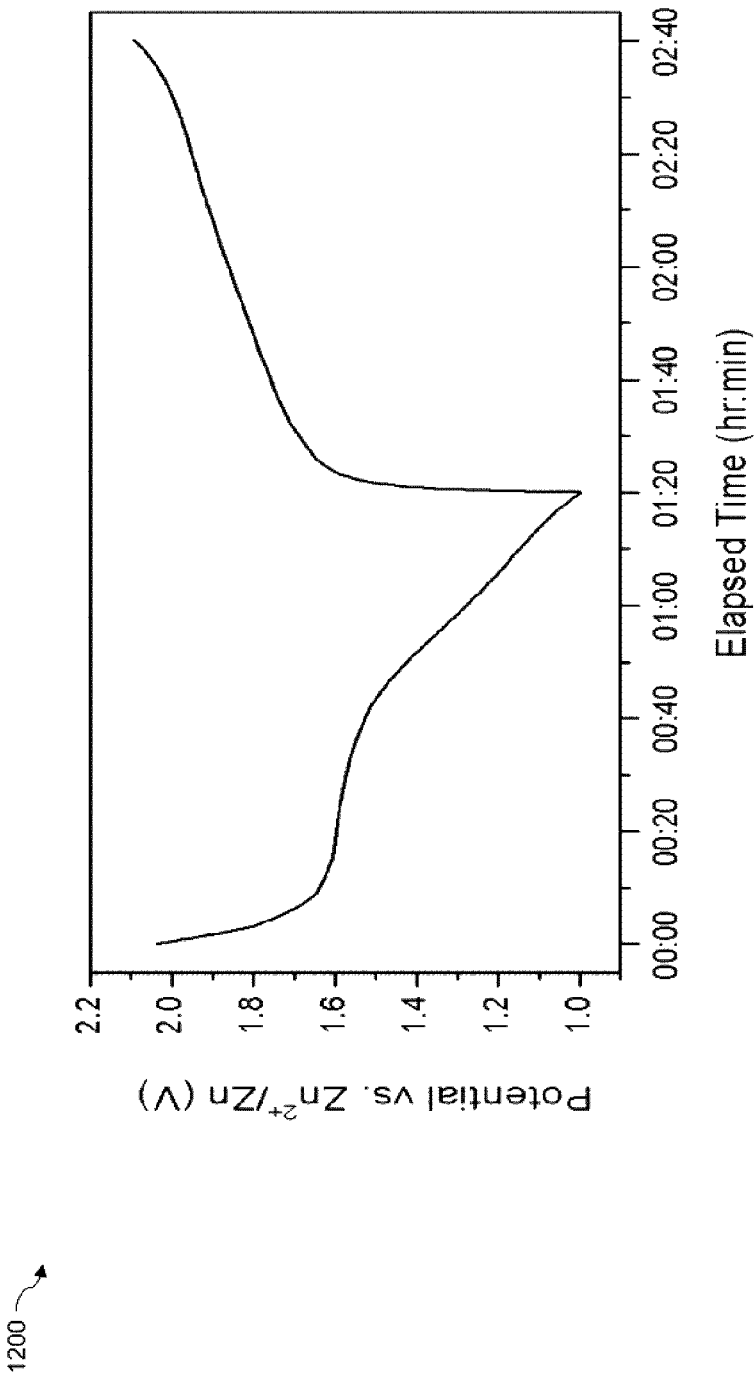
FIG. 12 is a graph illustrating a first galvanostatic discharge/charge voltage profile of a zinc metal battery using a hydrated layered $K_{0.26}Ni_{1/3}Mn_{1/3}Co_{1/3}O_2 \cdot nH_2O$ as the positive electrode material, according to an embodiment.

Referring now to FIG. 12, shown therein is a graph 1200 of a first galvanostatic cycle of a zinc metal battery including a zinc foil negative electrode, 1 M $ZnSO_4/H_2O$ electrolyte, and $K_{0.22}Ni_{1/3}Mn_{1/3}Co_{1/3}O_2 \cdot nH_2O$ as the positive electrode active material (e.g. active material 4 of FIG. 1).

The cell was discharged first where solvated $Zn^{2+}$ is intercalated into the interlamellar space 350. The discharge provided an average voltage of 1.5 V with a sloping profile associated with the reduction of mixed $Ni^{4+}/Ni^{3+}$, $Mn^{4+}/Mn^{3+}$, and $Co^{4+}/Co^{3+}$ redox centers 360 in the active slab layers 320.

Upon charge, the solvated $Zn^{2+}$ was deintercalated from the interlamellar space 350 with near 100% coulombic efficiency.

Figure 13:
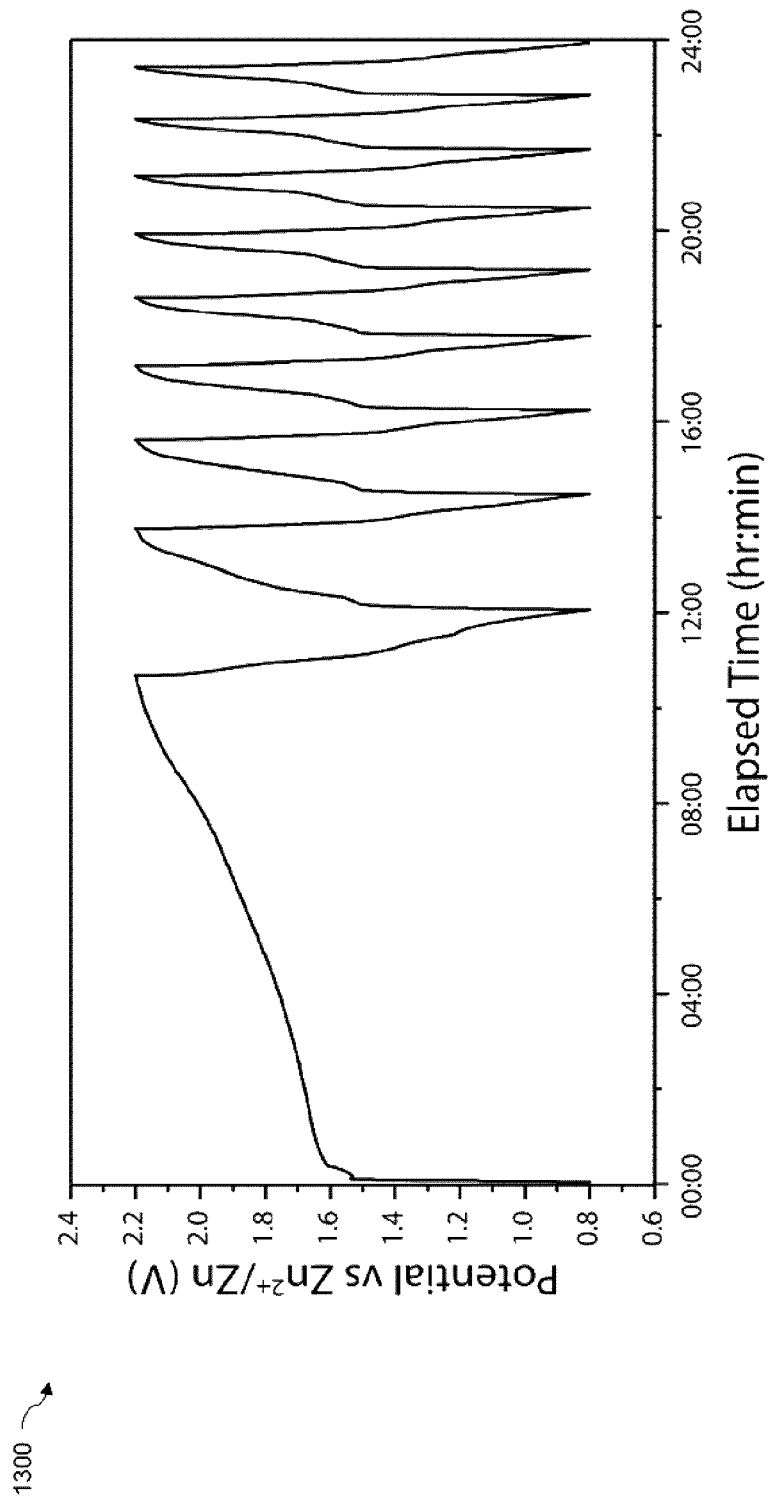
FIG. 13 is a graph illustrating galvanostatic cycling of a zinc metal battery using $LiNi_{1/3}Mn_{1/3}Co_{1/3}O_2$ as the positive electrode material, according to an embodiment.

Referring now to FIG. 13, shown therein is a graph 1300 of a first galvanostatic cycle of a zinc metal battery including the parent material $LiNi_{1/3}Mn_{1/3}Co_{1/3}O_2$ as the positive electrode. Graph 1300 provides a comparative example to graph 1200. The fully lithiated material was charged first to deintercalate $Li^+$ in order to create vacancies in the interlamellar space 350. Upon discharge, however, only residual $Li^+$ in the electrolyte which was originally in the structure was able to intercalate into the interlamellar space 350 since the d-spacing 330 is too small (4.76 Å) to accommodate solvated $Zn^{2+}$. This is in contrast with the cell of FIG. 12, where no $Li^+$ is present in the electrolyte (only $Zn^{2+}$).

In another aspect, methods of preparing hydrated layered electrode materials disclosed herein (e.g. layered material 300 of FIG. 3) are provided. The layered electrode materials maybe be prepared from transition metal precursors and chemical intercalation of alkali metals ions.

Prepared layered electrode materials may have a similar morphology to that of the transition metal precursors. Metal hydroxide, carbonate or oxide precursors may be used. A targeted chemical composition process may be used. One example of targeted chemical composition is $Na_{0.3}NiO_2 \cdot 0.7H_2O$. The $Na_{0.3}NiO_2 \cdot 0.7H_2O$ composition may be achieved from $Ni(OH)_2$ or $NiCO_3$ precursors prepared by a coprecipitation method or from NiO. The sodium may be introduced as NaOH, $Na_2CO_3$ or $Na_2O_2$ concurrently to calcining the precursor between 600° C. to 900° C.

Following the incorporation of sodium into the layered structure, hydration can be realized by mild oxidation in aqueous media.

Figure 14A:
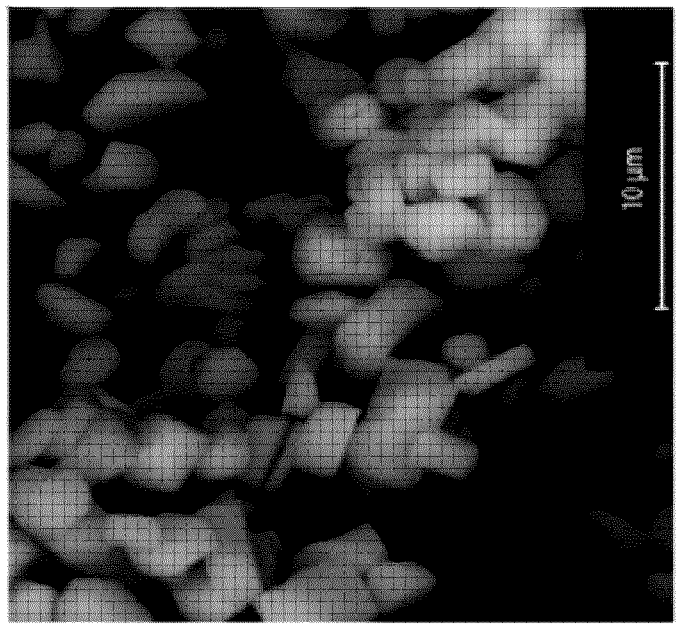
FIG. 14A is a scanning electron microscope image for a hydrated layered $Na_{0.3}NiO_2 \cdot 0.7H_2O$, according to an embodiment.

Referring now to FIG. 14A, shown therein is a scanning electron microscope image for the hydrated layered $Na_{0.3}NiO_2 \cdot 0.7H_2O$. As illustrated in FIG. 14A, the resulting hydrated layered $Na_{0.3}NiO_2 \cdot 0.7H_2O$ maintained the morphology of the NiO precursor, with a very narrow particle size distribution.

Figure 14B:
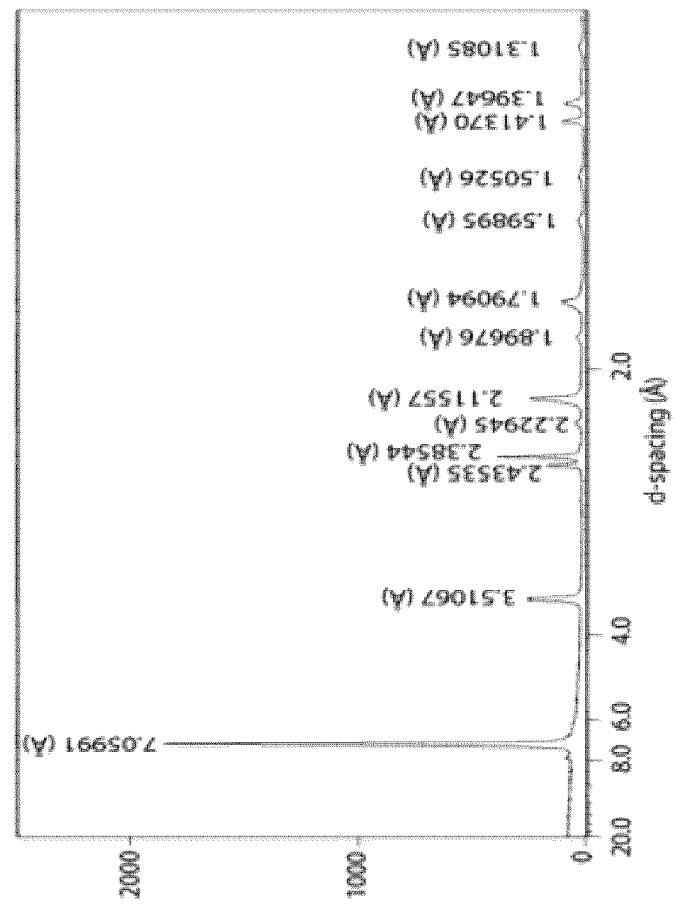
FIG. 14B is a graph illustrating an X-ray diffraction pattern for a hydrated layered $Na_{0.3}NiO_2 \cdot 0.7H_2O$, according to an embodiment.

Referring now to FIG. 14B, shown therein is a graph 1400b of an XRD pattern for the hydrated layered $Na_{0.3}NiO_2 \cdot 0.7H_2O$. The graph 1400b illustrates the successful incorporation of water molecules in the interlamellar space 50, with a d-spacing 330 of 7.1 Å significantly wider than the anhydrous $NaNiO_2$ intermediate. Accordingly, this kind of synthesis strategy can be widely applied to obtain a variety of hydrated layered electrode materials with controlled morphology (e.g. for use as layered material 300 of FIG. 3).

Figure 15:
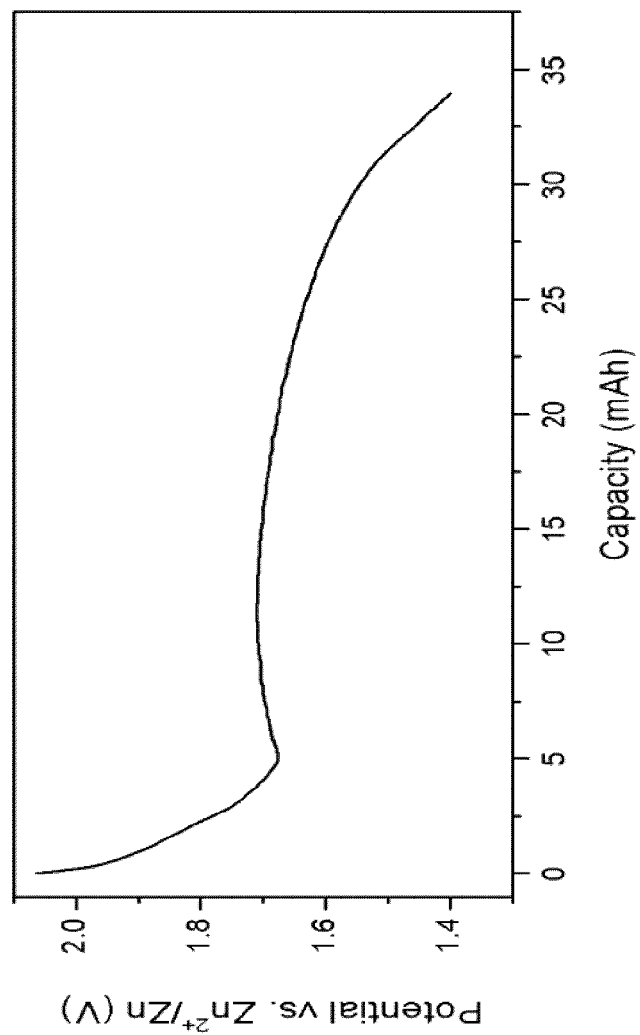
FIG. 15 is a graph illustrating a first galvanostatic discharge profile of a zinc metal battery using the $Na_{0.3}NiO_2 \cdot 0.7H_2O$ as the positive electrode, according to an embodiment.

Referring now to FIG. 15, shown therein is a first galvanostatic discharge curve 1500 for a zinc metal battery including $Na_{0.3}NiO_2 \cdot 0.7H_2O$ material as a positive active material of a positive electrode (e.g. active material 4 of positive electrode 20 of FIG. 1). Intercalation of solvated $Zn^{2+}$ into the interlamellar space 350 between the $NiO_2$ slabs (e.g. active metal slabs 20 of FIG. 3) of $Na_{0.3}NiO_2 \cdot 0.7H_2O$ provided an average discharge voltage of 1.7 V and a specific capacity of about 180 mAh/g.

The following paragraphs describe the experimental methods used herein.

All electrochemical cells were assembled using a homemade plate design comprising a rubber gasket sandwiched between two acrylic plates. The acrylic plates were bolted together and housed the electrode stack (negative/separator/positive). The electrode stack was compressed together between Ti plates by external screws (torque of 2 in.-lb) which also served as electrical connections.

The zinc-ion cells (e.g. zinc ion cells shown in FIGS. 10, 12, 13, and 15) were assembled using a zinc negative electrode, 5.5 cm×5.5 cm), a separator with ~3 mL of electrolyte, and a positive electrode (5 cm×5 cm) comprising a coating of active material on a current collector. The zinc negative electrode was a piece of zinc foil (30 μm thick, Linyi Gelon LIB Co., Ltd.). The separator used was glass fiber filter membrane (~300 μm thick). The electrolyte was 1 M $ZnSO_4$ dissolved in water for all cells with the exception of the cell of FIG. 10 where 1 M $ZnSO_4$+0.1$MnSO_4$ in water was used.

The positive electrodes were prepared by casting a slurry of 87.5 wt. % active material, 6 wt. % Vulcan XC72 carbon black (Cabot Corp.), 2 wt. % activated carbon, 0.1 wt. % oxalic acid, and 4 wt. % PTFE binder in a 2-propanol/water mixture (1:1 vol. ratio) as the solvent onto a sheet of carbon paper (P50, Fuel Cell Store) using a doctor blade. PTFE powder (1 μm particles, Sigma-Aldrich) was first dispersed into pure 2-propanol (20 wt. % dispersion) before adding to the slurry mixture. After casting, the electrode was dried at room temperature. The electrolyte used in this cell was 1 M $ZnSO_4$+0.1 M $MnSO_4$ in water. The separator used was paper filter (160 μm thick). The zinc negative electrode was a piece of zinc foil (30 μm thick, Linyi Gelon LIB Co., Ltd.). The cells were cycled at 0.2 mA/cm$^2$ at room temperature (23±2° C.).

The active materials were synthesized with the exception of the $LiNi_{1/3}Co_{1/3}Mn_{1/3}O_2$ (NMC) used in the positive electrode of the cell shown in FIG. 13, which was purchased from MTI Corp.

The layered nickel oxyhydroxides shown in FIG. 7 were prepared by a room-temperature precipitation/oxidation method. Briefly, β-NiOOH was formed by slowly adding a 0.8 M solution of NaOH to a 0.3 M solution of $NiSO_4.6H_2O$. The light green precipitate was the vacuum filtered and washed with water until the pH of the filtrate was neutral. This product was then placed in a solution containing 3 M NaOH and 5 wt. % NaOCl. The green product quickly turned to black and the mixture was allowed to react for 2.5 hours before filtering and washing again. The final black powder was dried at 60° C. overnight. The Al-stabilized NiOOH ($Ni_{0.8}Al_{0.2}(CO_3)_{0.1}OOH \cdot 0.66H_2O$) was synthesized by slowly adding a solution containing 0.4 M $NiSO_4.6H_2O$ and 0.1 M $Al_2(SO_4)_3.18H_2O$ to a second solution containing 2 M NaOH and 0.1 M $Na_2CO_3$. The light green precipitate was the vacuum filtered and washed with water until the pH of the filtrate was neutral. This product was then placed in a solution containing 3 M NaOH and 5 wt. % NaOCl on ice. The green product quickly turned to black and the mixture was allowed to react for 2.5 hours. The mixture temperature was never allowed to rise above 20° C. Finally, the black product was filtered, washed, and dried for 3 days at room temperature.

The layered materials shown in FIG. 8 were prepared from chemical oxidation of $Mn^{2+}$ by hydrogen peroxide in the presence of tetramethylammonium [TMA] hydroxide). Typically, 20 mL of a mixed aqueous solution of 0.6 M TMAOH and 3 wt % $H_2O_2$ was added rapidly to 10 mL of 0.3 M $MnCl_2.4H_2O$ aqueous solution. The resulting dark brown suspension was stirred overnight at room temperature. This colloidal suspension of birnessite monosheets was used as the precursor for all three materials. $K_{0.2}MnO_2.1.2H_2O$ was obtained by mixing the colloidal suspension of the monosheets with a KCl aqueous solution. Typically, 50 mL of 1 M KCl aqueous solution was added dropwise to 50 mL of the colloidal suspension of $MnO_2$ monosheets (0.02 mol/L) at room temperature. After the solution was left to stand at room temperature for 24 hours, the resulting black precipitate was filtered off, washed with deionized water, and dried at 60° C. in a preheated vacuum oven overnight. $TMA_{0.2}MnO_2.1.2H_2O$ was obtained by simple filtration of the nanosheet suspension followed by washing with deionized water and drying at 60° C. in a preheated vacuum oven overnight. $TBA_{0.2}MnO_2.1.2H_2O$ was obtained by redispersing $TMA_{0.2}MnO_2.1.2H_2O$ powder (60 mmol) in a TBAOH solution (1.5 L, 0.1 mol/L). The suspension was left to stir at room temperature for 48 hours and the dried aggregate was separated by filtration followed by washing with deionized water and drying at 60° C. in a preheated vacuum oven overnight.

The positive electrode active material of the cell shown in FIG. 10 was synthesized by a room temperature solution method. In a typical synthesis, 600 mL of an aqueous solution containing 0.53 mol/L (M) $Mn(CH_3CO_2)_2.4H_2O$ and 0.1 M $Mg(CH_3CO_2)_2.4H_2O$ was slowly added to 600 mL of 13.3 M NaOH over a period of an hour. A 600 mL aqueous solution of 0.2 M $KMnO_4$ was prepared and added drop wise to the previous solution over 1 hour. The slurry was aged statically at room temperature for 15 days. The slurry was filtered and rinsed with water until the pH of filtered solution was below 9.5. An aliquot of the slurry was dried to obtain birnessite and the remaining aliquot was dispersed in 1.8 L water and allowed to age for 2 days to form stable buserite. Following that, the solid was collected to perform ion exchange of magnesium with zinc by dispersing solid in 1 L of 1 M $ZnSO_4$ for 24 hours. Lastly, the product was filtered, rinsed with water, and dried at 60° C. in a preheated vacuum oven overnight.

The positive electrode active material ($K_{0.22}Ni_{0.33}Co_{0.33}Mn_{0.33}O_2 \cdot nH_2O$) characterized in FIG. 11 and used in the cell shown in FIG. 12 was synthesized starting with commercial NMC (MTI Corp.). In a typical synthesis, 80 g of commercial $LiNi_{1/3}Mn_{1/3}Co_{1/3}O_2$ was dispersed in 800 mL 1 M HCl with stirring to protonate and remove Li. The HCl solution was refreshed everyday for 10 days. After 10 days, the solid was filtered, rinsed with water until filtered solution was neutral, and dried at 60° C. in a preheated vacuum oven overnight. 8 g of previously dried protonated product was dispersed in 800 mL of 0.04 M tetramethylammonium hydroxide solution and allowed to stir for 1 day to suspend solid in solution. The suspension was flocculated in 2 L of 1.5 M KCl and allowed to stir for one day. Flocculated solid was filtered, rinse with water, and dried at 60° C. in a preheated vacuum oven overnight.

The positive electrode active material ($Na_{0.3}NiO_2 \cdot 0.7H_2O$) characterized in FIG. 14 and used in the cell shown in FIG. 15 was synthesized by a solid-state method. In a typical synthesis, NiO was mixed and ground with 20% mol excess of $Na_2O_2$ using a mortar and pestle. The solid was transferred to an alumina crucible and placed in a tube furnace under $O_2$ atmosphere. The tube furnace was heated up to 600° C. at a rate of 5° C./min, held for 8 hours at 600° C., and cooled to room temperature at 5° C./min. Once cooled, the product was transferred to a 300 mL solution of 1.6 mol excess $Na_2S_2O_8$ with pH>10.5 using $NH_4OH$. The final product was filtered, rinsed with water, and dried at 60° C. in a preheated vacuum oven overnight.

While the above description provides examples of one or more apparatus, methods, or systems, it will be appreciated that other apparatus, methods, or systems may be within the scope of the claims as interpreted by one of skill in the art.

The invention claimed is:

1. A layered electrode material for use in a positive electrode of an electrochemical rechargeable zinc battery, the rechargeable zinc battery including a negative electrode comprising zinc and an electrolyte comprising a zinc salt dissolved in water with a pH value between 1 and 7, the layered electrode material comprising:
a plurality of active metal slab layers in a layered configuration, wherein an active metal slab layer comprises:
a plurality of redox active metal centers, M, comprising manganese and at least two other redox active metals, wherein the at least two other redox active metals maintain the layered configuration of the active metal slab layer during cycling;
at least one pillar species; and
a closely-packed anionic sublattice;
a plurality of interlamellar spaces, wherein an interlamellar space separates adjacent active metal slab layers in the layered configuration, and wherein the interlamellar space includes the at least one pillar species;
wherein the layered electrode material has a combined average metal oxidation state in a range of +3 to +4 in an initial charged state; and
wherein the layered electrode material accepts solvated zinc cations via intercalation into the interlamellar space upon reduction, wherein the zinc cations react with the redox active metal centers, M.

2. The layered electrode material of claim 1, wherein the redox active metal centers comprise at least one of chromium, iron, nickel, and cobalt.

3. The layered electrode material of claim 1, wherein the at least one pillar species comprises water molecules.

4. The layered electrode material of claim 1, wherein the at least one pillar species comprises a cationic pillar species.

5. The layered electrode material of claim 1, wherein the anionic sublattice comprises a single layer.

6. The layered electrode material of claim 1, wherein the anionic sublattice comprises a plurality of layers.

7. The layered electrode material of claim 1, wherein the anionic sublattice comprises an anionic species comprising at least one of an oxide, a sulfide, a fluoride, a hydroxide, a borate, a phosphate, a sulfate, a silicate, and an aluminate.

8. The layered electrode material of claim 1, wherein the anionic sublattice comprises a combination of two or more anionic species.

9. The layered electrode material of claim 4, wherein the cationic pillar species comprises at least one cationic species or other ions which include an element selected from a group consisting of hydrogen, ammonium, tetraalkylammonium, alkali metals, alkaline earth metals, d-block metals, and f-block metals.

10. The layered electrode material of claim 1, wherein adjacent slab layers have a d-spacing between 7 angstroms and 20 angstroms.

11. A composite positive electrode for use in a rechargeable zinc battery comprising the layered electrode material of claim 1.

12. The composite positive electrode of claim 11, further comprising at least one conductive additive, and at least one binder.

13. A rechargeable zinc battery comprising the layered electrode material of claim 1.

14. The layered electrode material of claim 1, wherein the layered electrode material is synthesized using a wet chemistry or solid-state process.

15. The composite positive electrode of claim 12, wherein the layered electrode material, the at least one conductive additive, and the at least one binder form a homogeneous mixture created by dry mixing.

16. The composite positive electrode of claim 12, wherein the layered electrode material, the at least one conductive additive, and the at least one binder form a homogenous mixture created by slurry mixing in a solvent.

17. A rechargeable zinc battery comprising:
a positive electrode comprising a layered electrode material, wherein the layered electrode material comprises:
a plurality of active metal slab layers in a layered configuration, wherein an active metal slab layer comprises:
a plurality of redox active metal centers, M, comprising manganese and at least two other redox active metals, wherein the at least two other redox active metals maintain the layered configuration of the active metal slab layer during cycling;
at least one pillar species; and
a closely-packed anionic sublattice;
a plurality of interlamellar spaces, wherein an interlamellar space separates adjacent active metal slab layers in the layered configuration, and wherein the interlamellar space includes the at least one pillar species;
wherein the layered electrode material has a combined average metal oxidation state in a range of +3 to +4 in an initial charged state; and
wherein the layered electrode material accepts solvated zinc cations via intercalation into the interlamellar space upon reduction, wherein the zinc cations react with the redox active metal centers, M;
a negative electrode comprising zinc;
an electrolyte for ionically coupling the negative electrode to the positive electrode, wherein the electrolyte comprises a zinc salt dissolved in water and has a pH value between 1 and 7; and
a separator disposed between the positive electrode and the negative electrode, wherein the separator is wetted by the electrolyte.

18. The rechargeable zinc battery of claim 17, wherein the negative electrode comprises zinc metal.

19. The rechargeable zinc battery of claim 17, wherein the electrolyte includes zinc ions in a range from 0.1 molar to 4 molar.

20. The rechargeable zinc battery of claim 17, wherein the rechargeable zinc battery has an average discharge voltage in the range of 1-3 V.

* * * * *